United States Patent
Kim et al.

(10) Patent No.: US 10,503,063 B2
(45) Date of Patent: Dec. 10, 2019

(54) SUPER WATER REPELLENT POLYMER HIERARCHICAL STRUCTURE, HEAT EXCHANGER HAVING SUPER WATER REPELLENCY, AND MANUFACTURING METHOD THEREFOR

(71) Applicant: Industry-University Cooperation Foundation Hanyang University, Seoul (KR)

(72) Inventors: Dong Rip Kim, Seoul (KR); Kwan-Soo Lee, Seoul (KR); Youngjun Cho, Osan-si (KR); Hanmin Jang, Seoul (KR); Heung Soo Lee, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 186 days.

(21) Appl. No.: 15/507,596

(22) PCT Filed: Jul. 22, 2015

(86) PCT No.: PCT/KR2015/007593
§ 371 (c)(1),
(2) Date: Feb. 28, 2017

(87) PCT Pub. No.: WO2016/036001
PCT Pub. Date: Mar. 10, 2016

(65) Prior Publication Data
US 2017/0282416 A1 Oct. 5, 2017

(30) Foreign Application Priority Data

Sep. 1, 2014 (KR) .................. 10-2014-0115489
Sep. 2, 2014 (KR) .................. 10-2014-0116094
May 18, 2015 (KR) .................. 10-2015-0068588

(51) Int. Cl.
*G03F 7/00* (2006.01)
*F28F 13/18* (2006.01)
(Continued)

(52) U.S. Cl.
CPC ............ *G03F 7/0002* (2013.01); *B29C 33/60* (2013.01); *B29C 33/62* (2013.01); *B29C 35/02* (2013.01);
(Continued)

(58) Field of Classification Search
None
See application file for complete search history.

(56) References Cited

U.S. PATENT DOCUMENTS

2013/0295327 A1* 11/2013 Zhang .................... B82Y 30/00
428/141
2014/0238646 A1* 8/2014 Enright ................. F28F 13/187
165/104.21

FOREIGN PATENT DOCUMENTS

JP 10-2008-0058398 A 6/2008
JP 2010155441 A 7/2010
(Continued)

OTHER PUBLICATIONS

Ou, Junfei, et al. "Superhydrophobic surfaces on light alloy substrates fabricated by a versatile process and their corrosion protection." ACS applied materials & interfaces 5.8 (Mar. 15, 2013): 3101-3107. (Year: 2013).*
(Continued)

*Primary Examiner* — Benjamin A Schiffman
(74) *Attorney, Agent, or Firm* — Sughrue Mion, PLLC

(57) ABSTRACT

Provided are a super water repellent polymer hierarchical structure, a heat exchanger having super water repellency, and a manufacturing method thereof A super water repellent polymer hierarchical structure can be simply and repeatedly
(Continued)

manufactured by using only a method for utilizing a super water repellent hierarchical structure and mechanically molding a polymer material thereon. In addition, a heat exchanger having super water repellency can be provided by providing super water repellency on the fin surface of a heat exchanger by using a dip method and vacuum drying.

15 Claims, 35 Drawing Sheets

(51) Int. Cl.
*B29C 41/00* (2006.01)
*B29C 33/62* (2006.01)
*B29C 35/02* (2006.01)
*B29C 41/08* (2006.01)
*B29C 59/00* (2006.01)
*B29C 33/60* (2006.01)
B29C 35/04 (2006.01)
B82Y 30/00 (2011.01)
B29C 33/42 (2006.01)
F28F 19/04 (2006.01)
B29C 59/02 (2006.01)

(52) U.S. Cl.
CPC .............. *B29C 41/00* (2013.01); *B29C 41/08* (2013.01); *B29C 59/005* (2013.01); *F28F 13/18* (2013.01); *F28F 13/185* (2013.01); *B29C 33/42* (2013.01); *B29C 2035/043* (2013.01); *B29C 2059/023* (2013.01); *B29K 2995/0093* (2013.01); *B82Y 30/00* (2013.01); *F28F 19/04* (2013.01); *F28F 2245/04* (2013.01); *F28F 2255/20* (2013.01)

(56) References Cited

FOREIGN PATENT DOCUMENTS

| | | | |
|---|---|---|---|
| JP | 2010-174269 A | 8/2010 |
| JP | 2010-270952 A | 12/2010 |
| JP | 2012-66417 A | 4/2012 |
| JP | 2013-36733 A | 2/2013 |
| KR | 10-2010-0003419 A | 1/2010 |
| KR | 10-2010-0033732 A | 3/2010 |
| KR | 10-2011-0126966 A | 11/2011 |
| KR | 10-2014-0005426 A | 1/2014 |
| KR | 101402353 B1 | 6/2014 |

OTHER PUBLICATIONS

International Search Report for PCTKR2015/007593 dated Oct. 21, 2015 [PCT/ISA/210].

* cited by examiner

[Fig. 1]
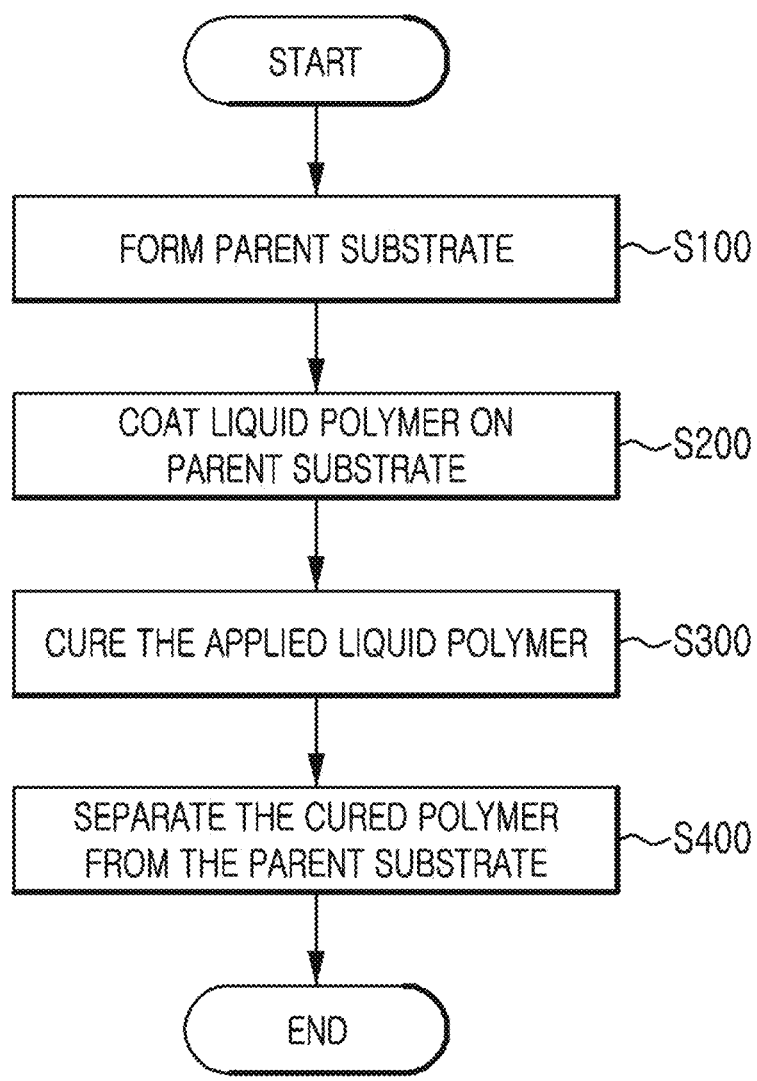

[Fig. 2]
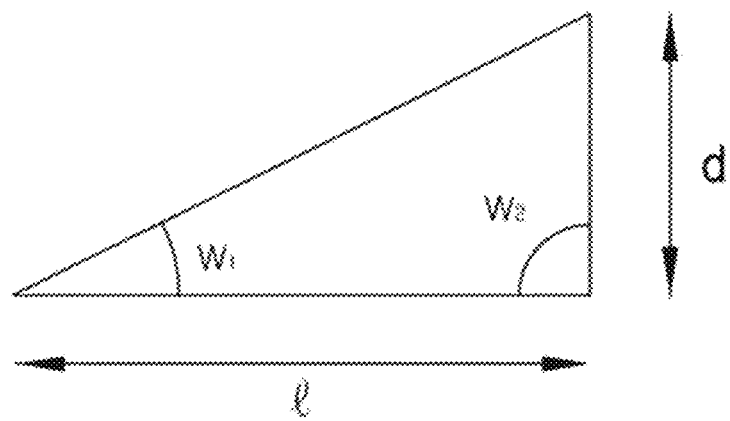
[Fig. 3]
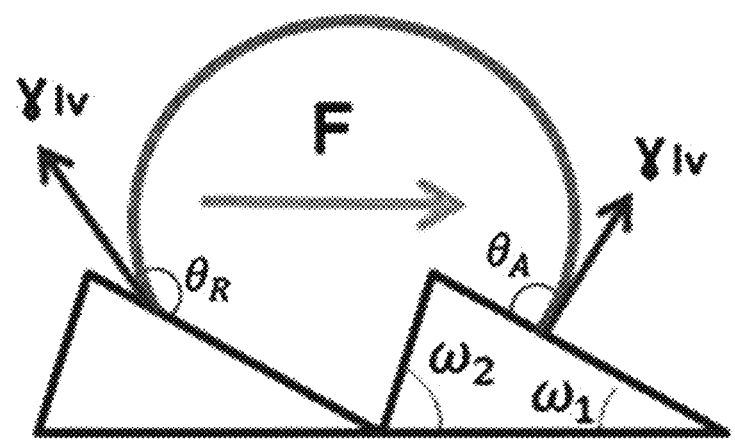

[Fig. 4]
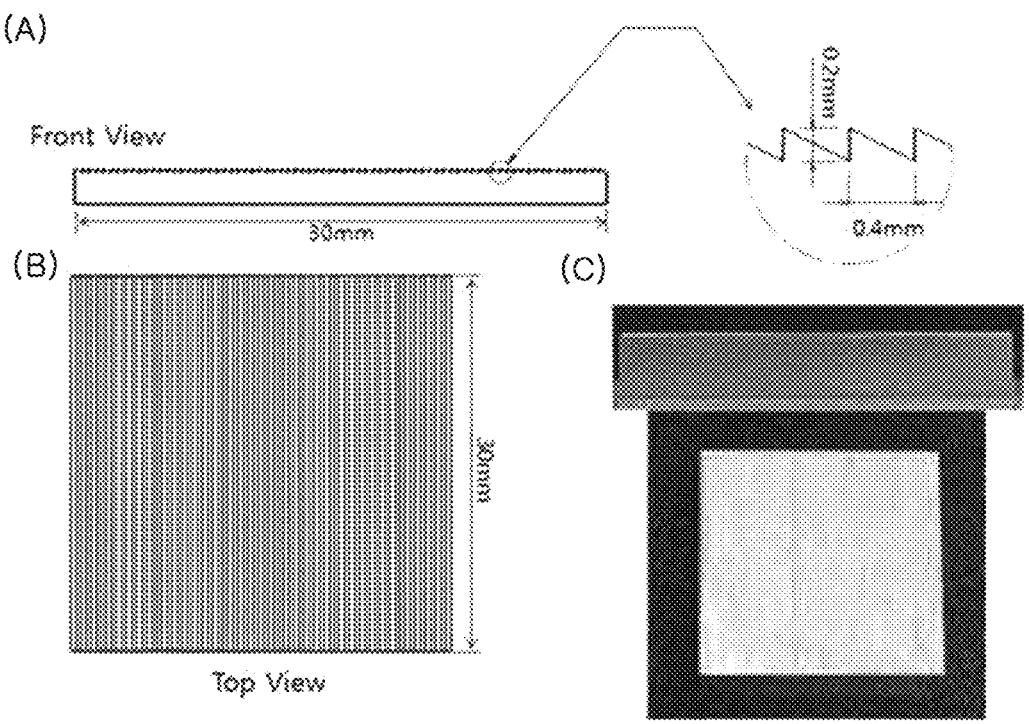

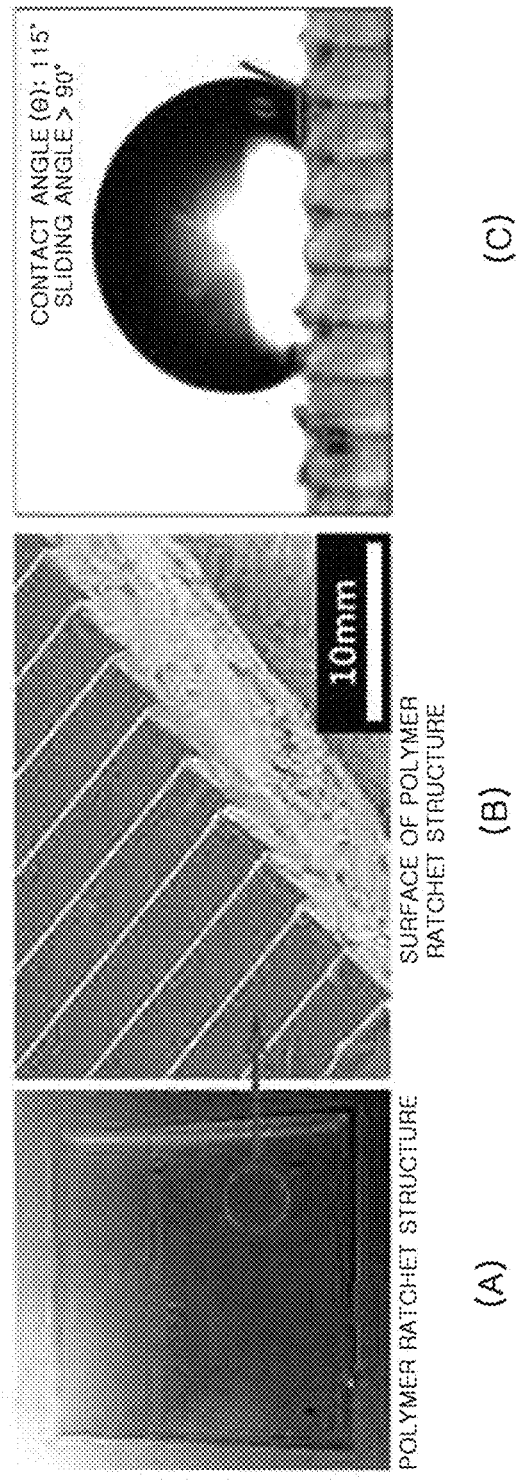
[Fig. 5]

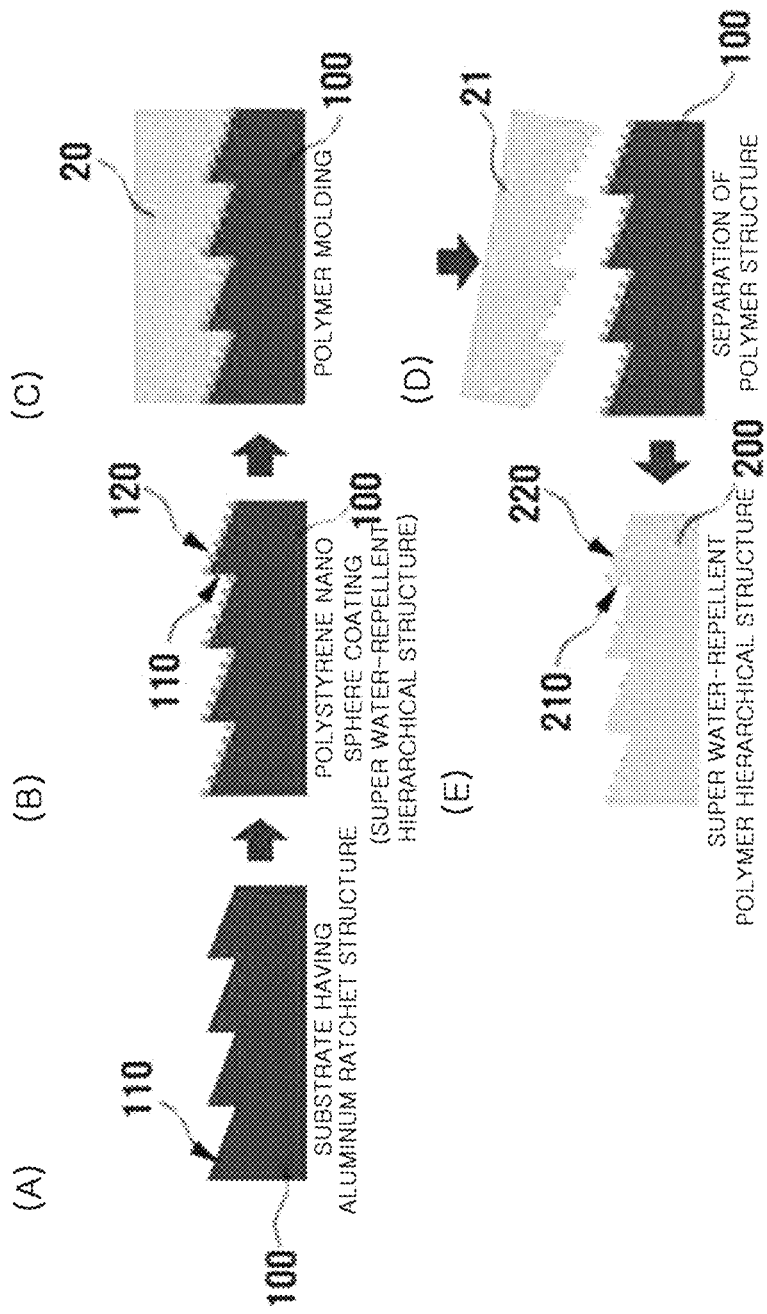
[Fig. 6]

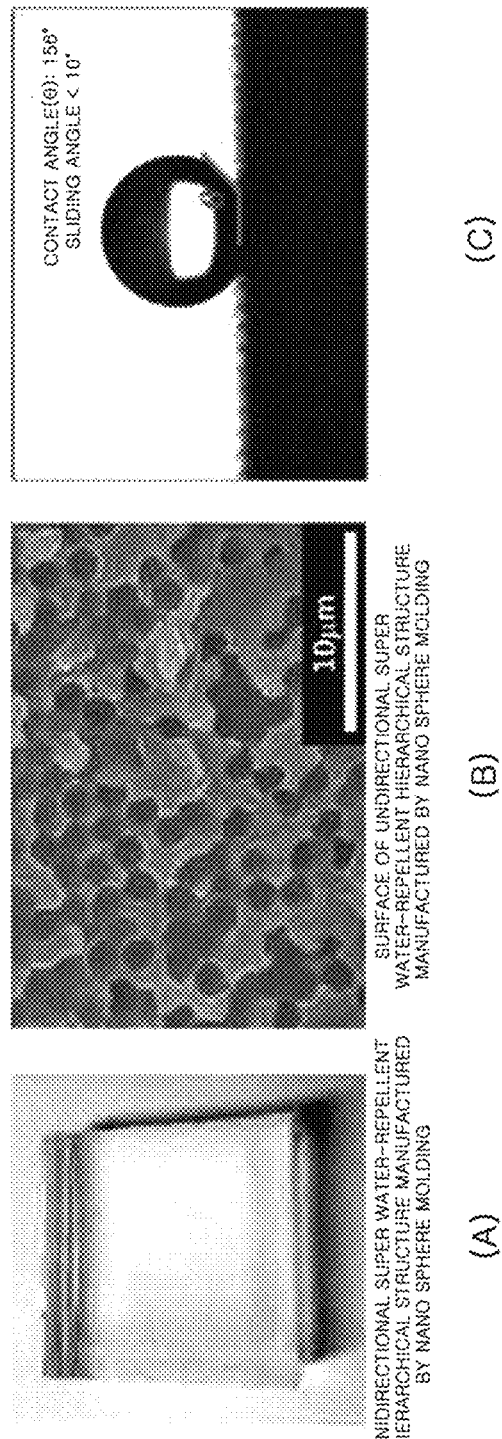
[Fig. 7]

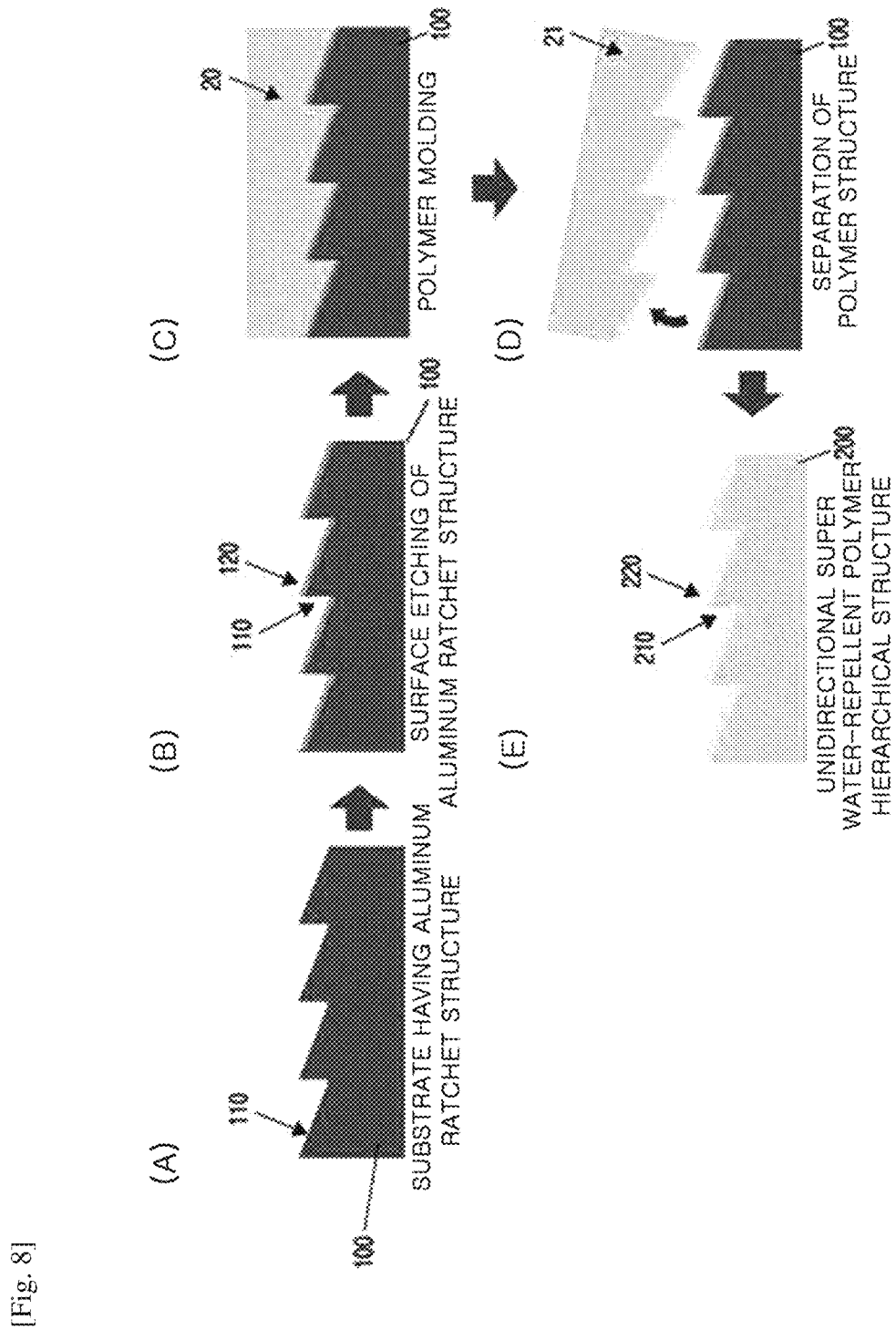

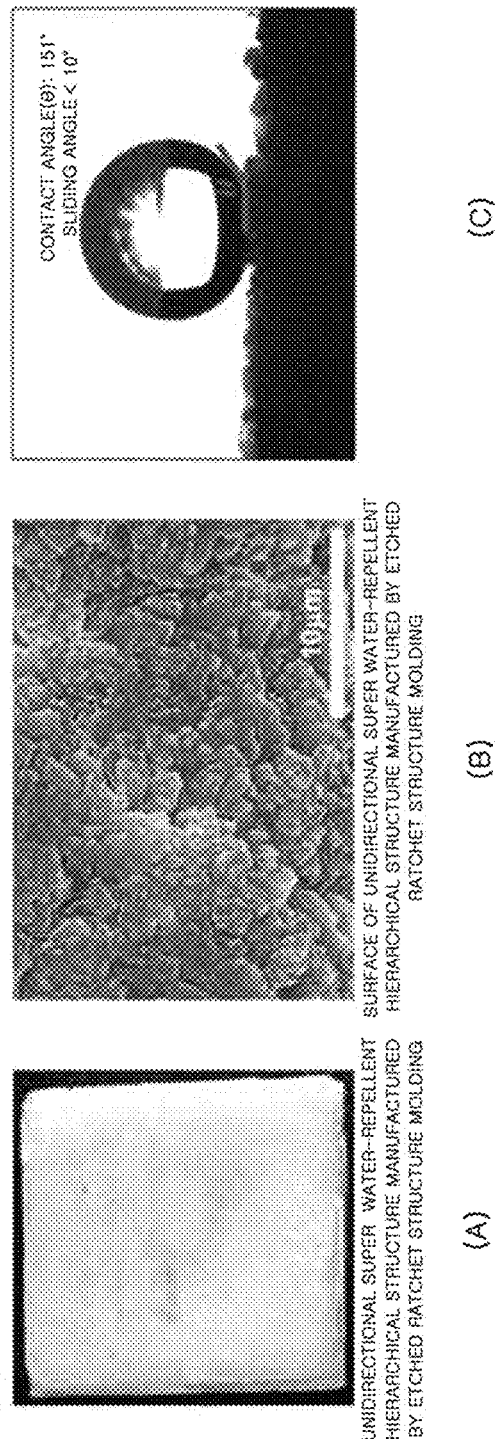
[Fig. 9]

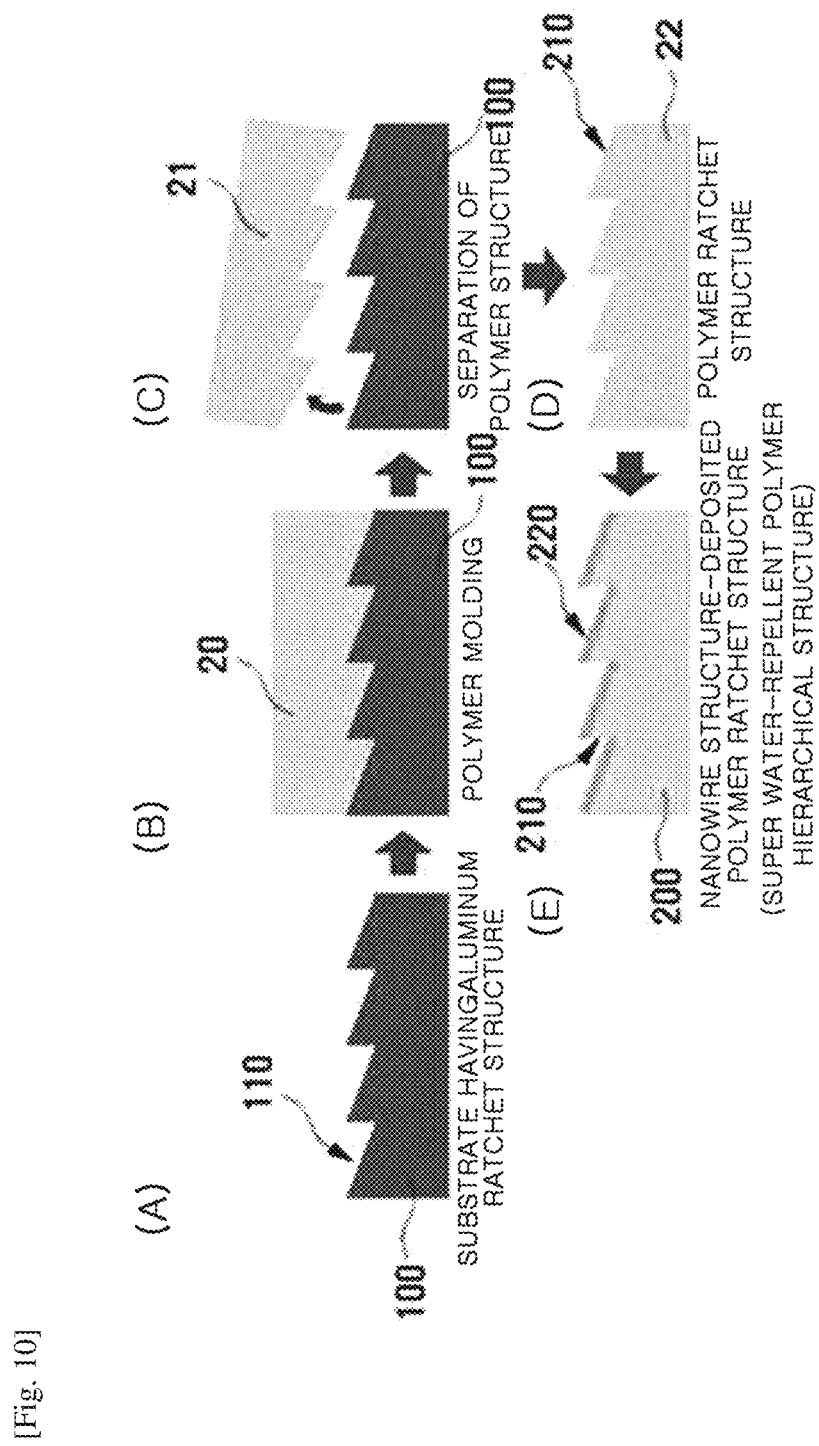

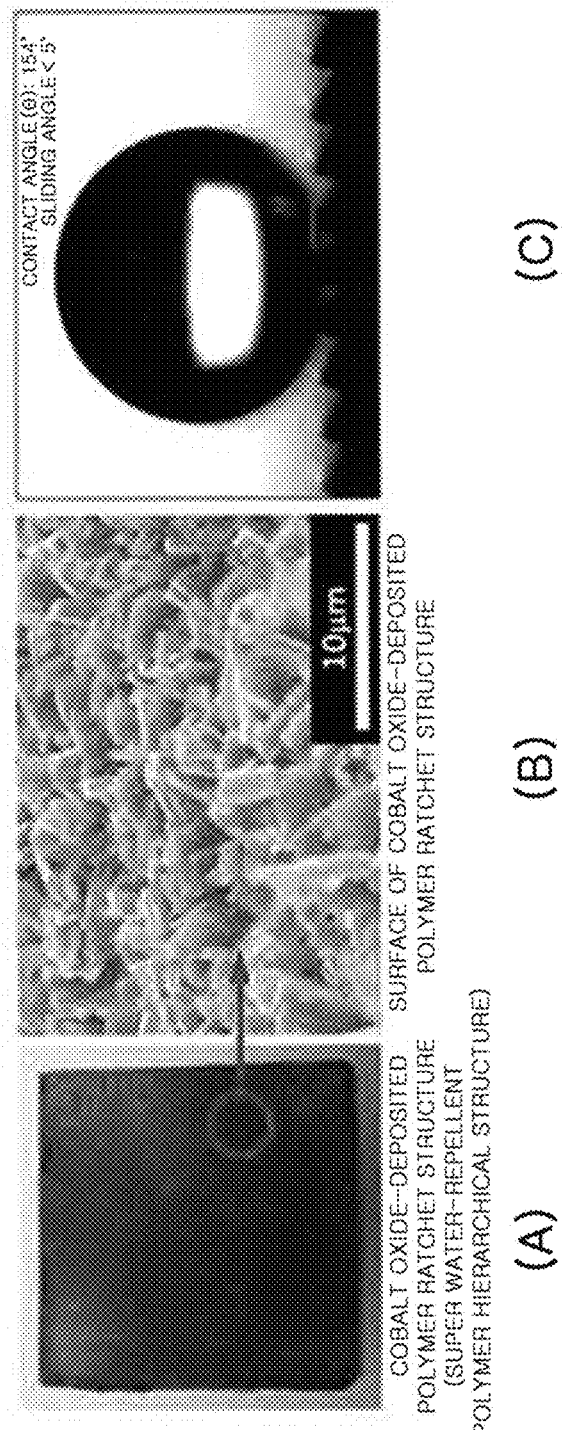
[Fig. 11]

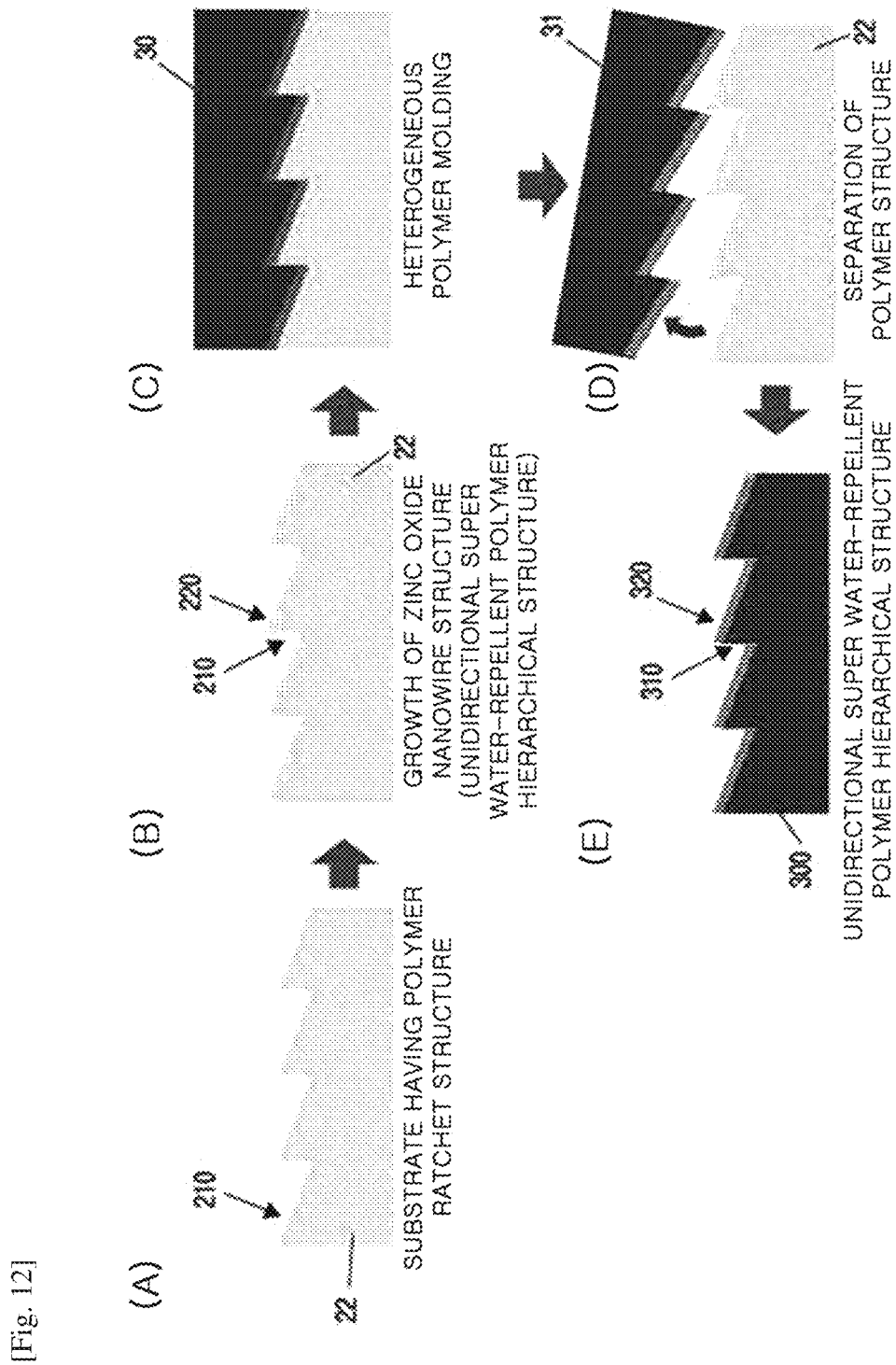
[Fig. 12]

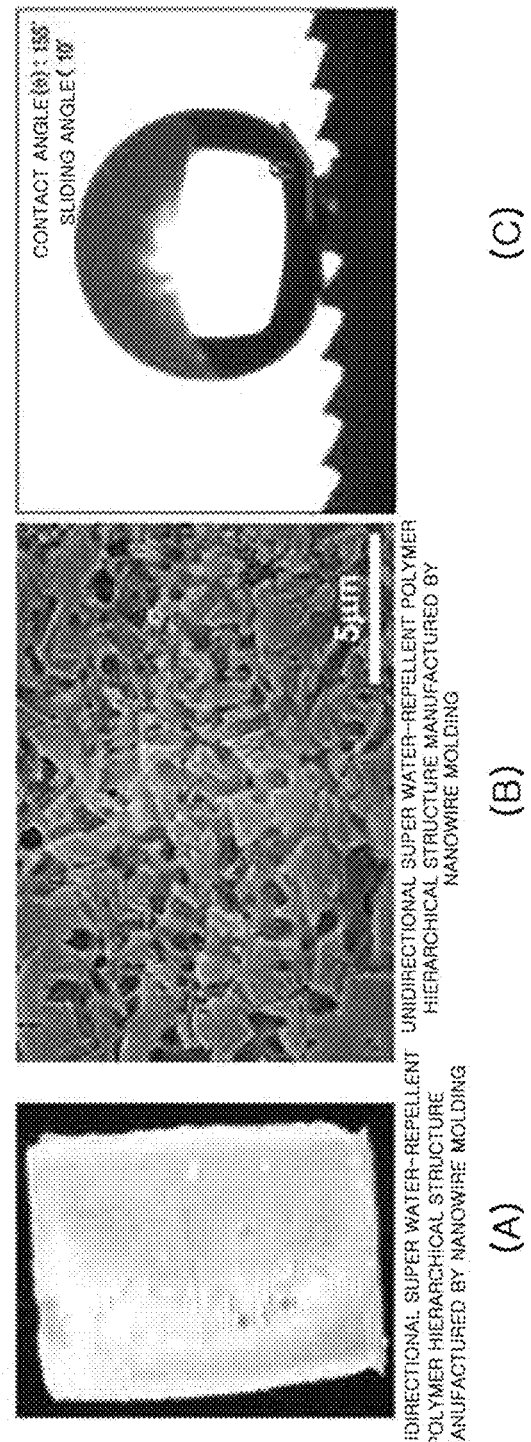
[Fig. 13]

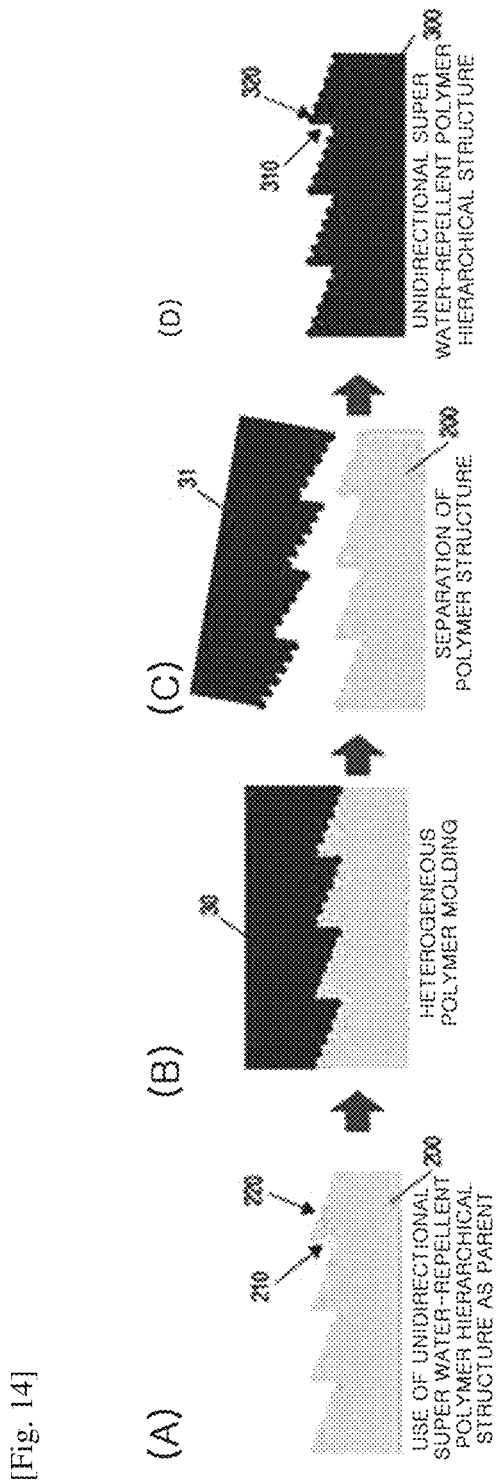
[Fig. 14]

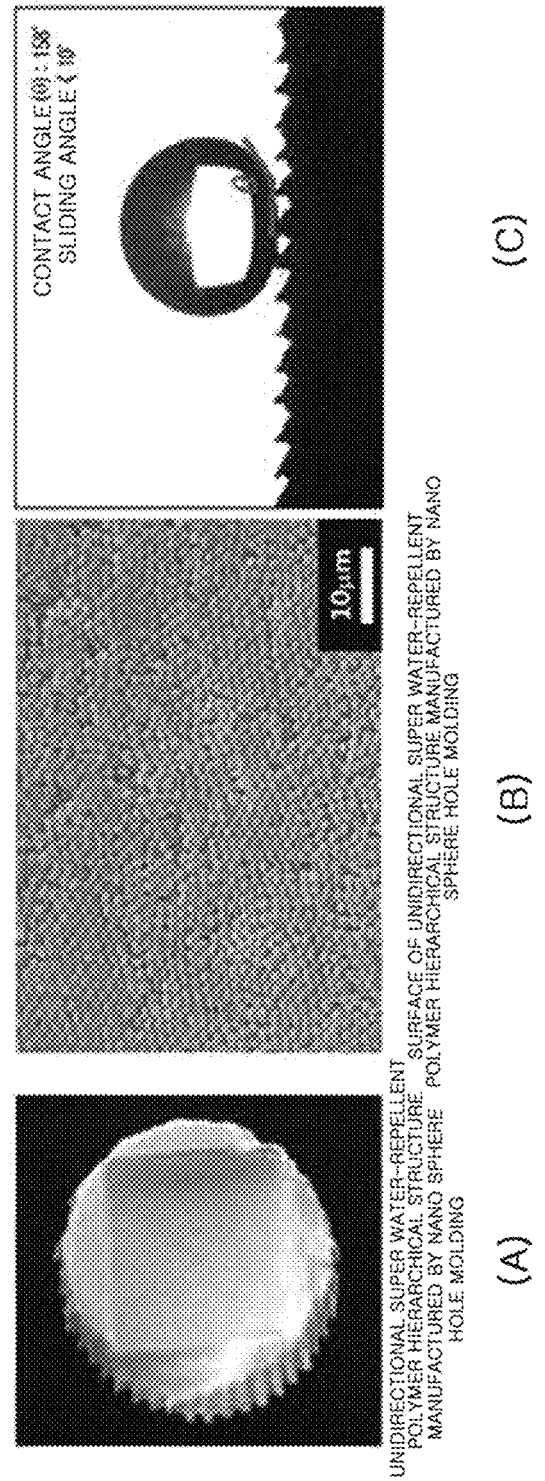
[Fig. 15]

[Fig. 16]
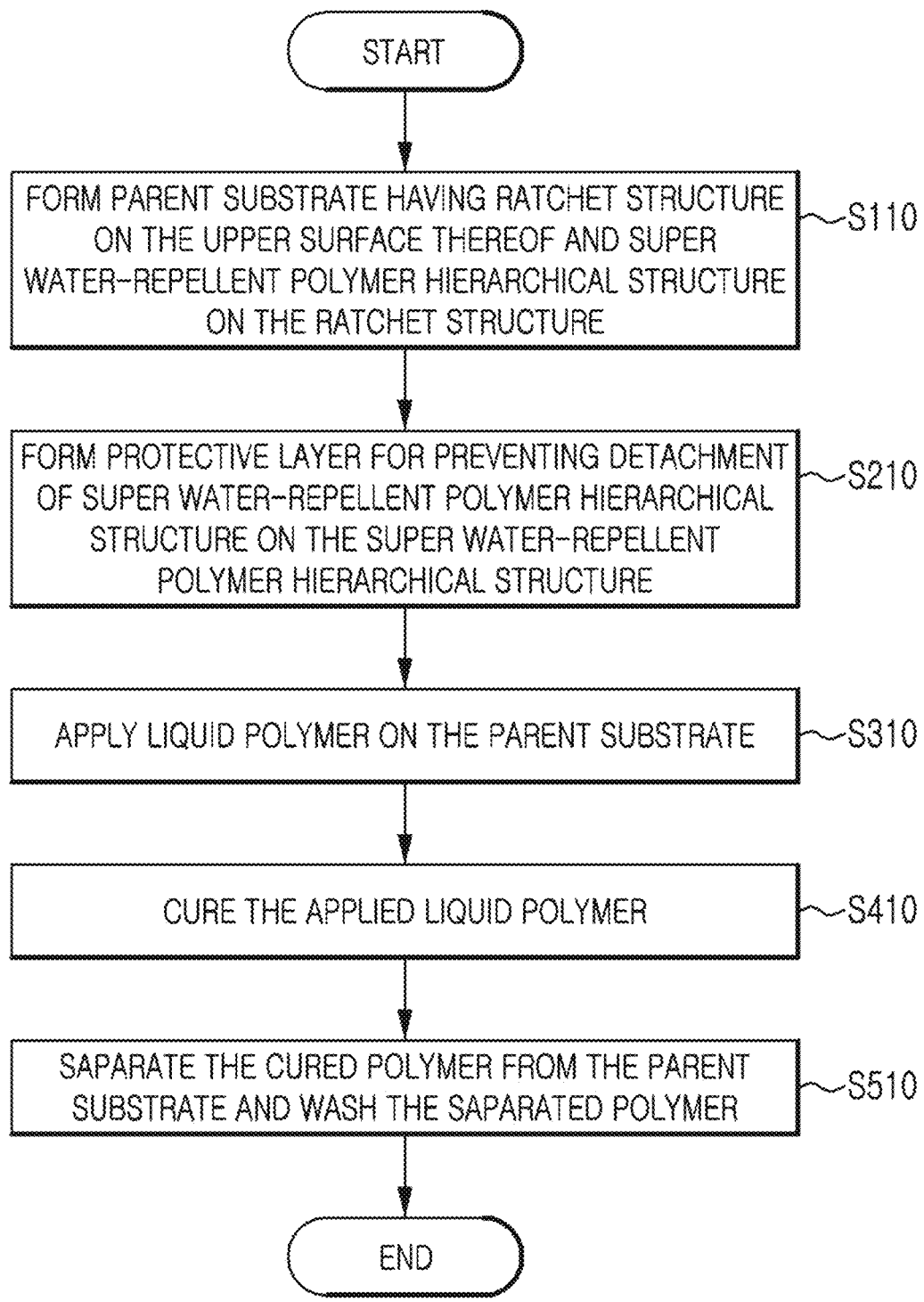

[Fig. 17]
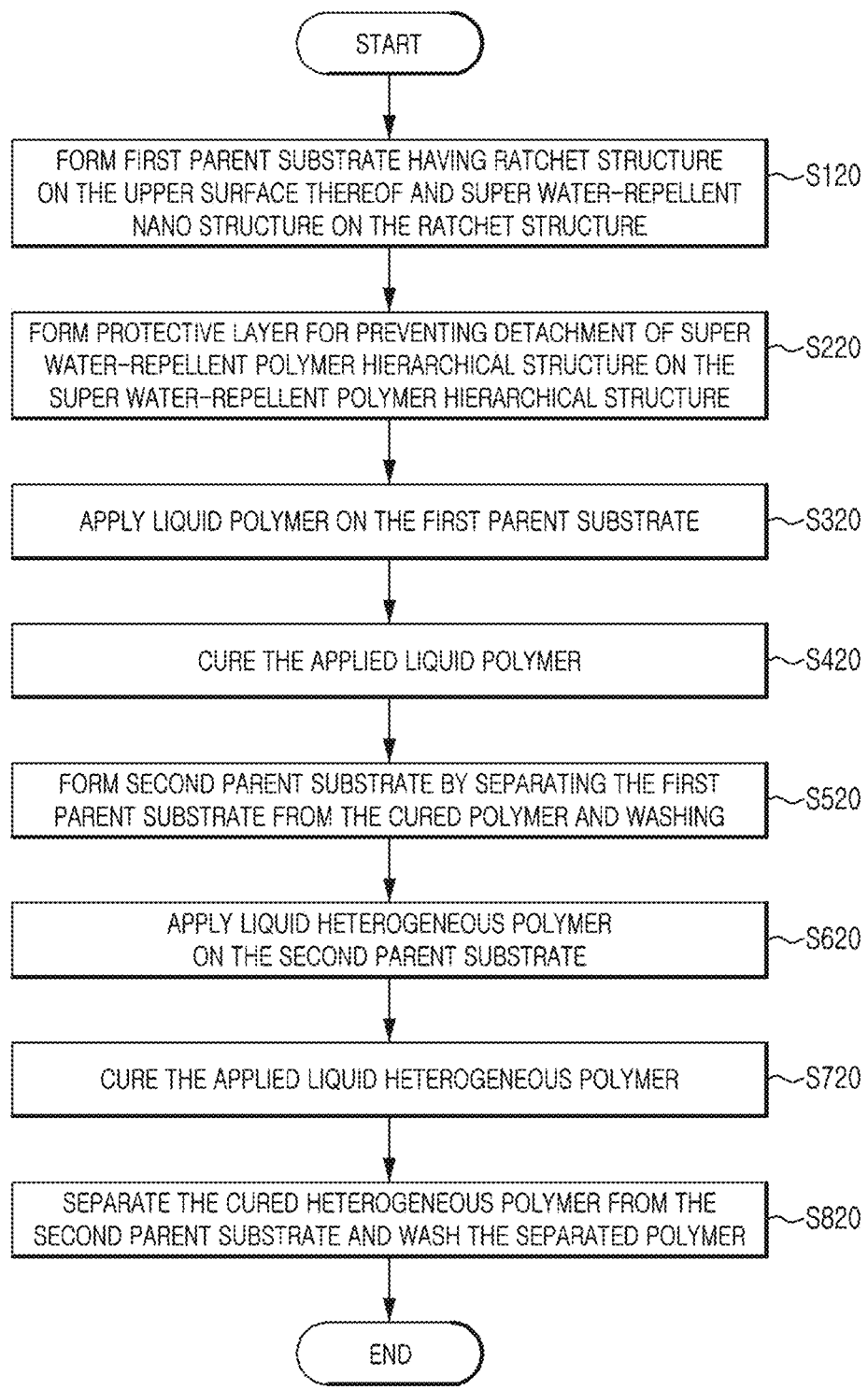

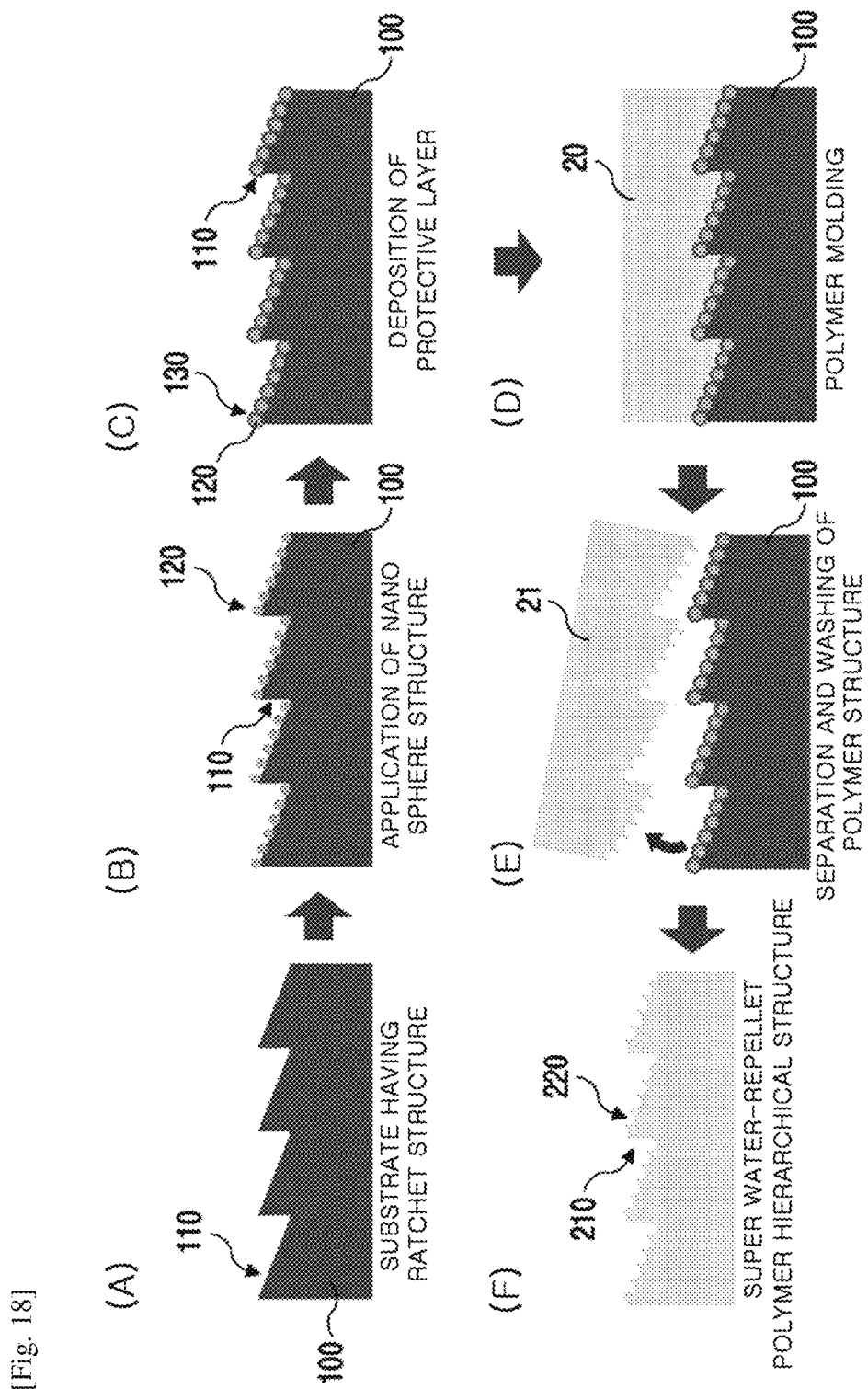

[Fig. 19]
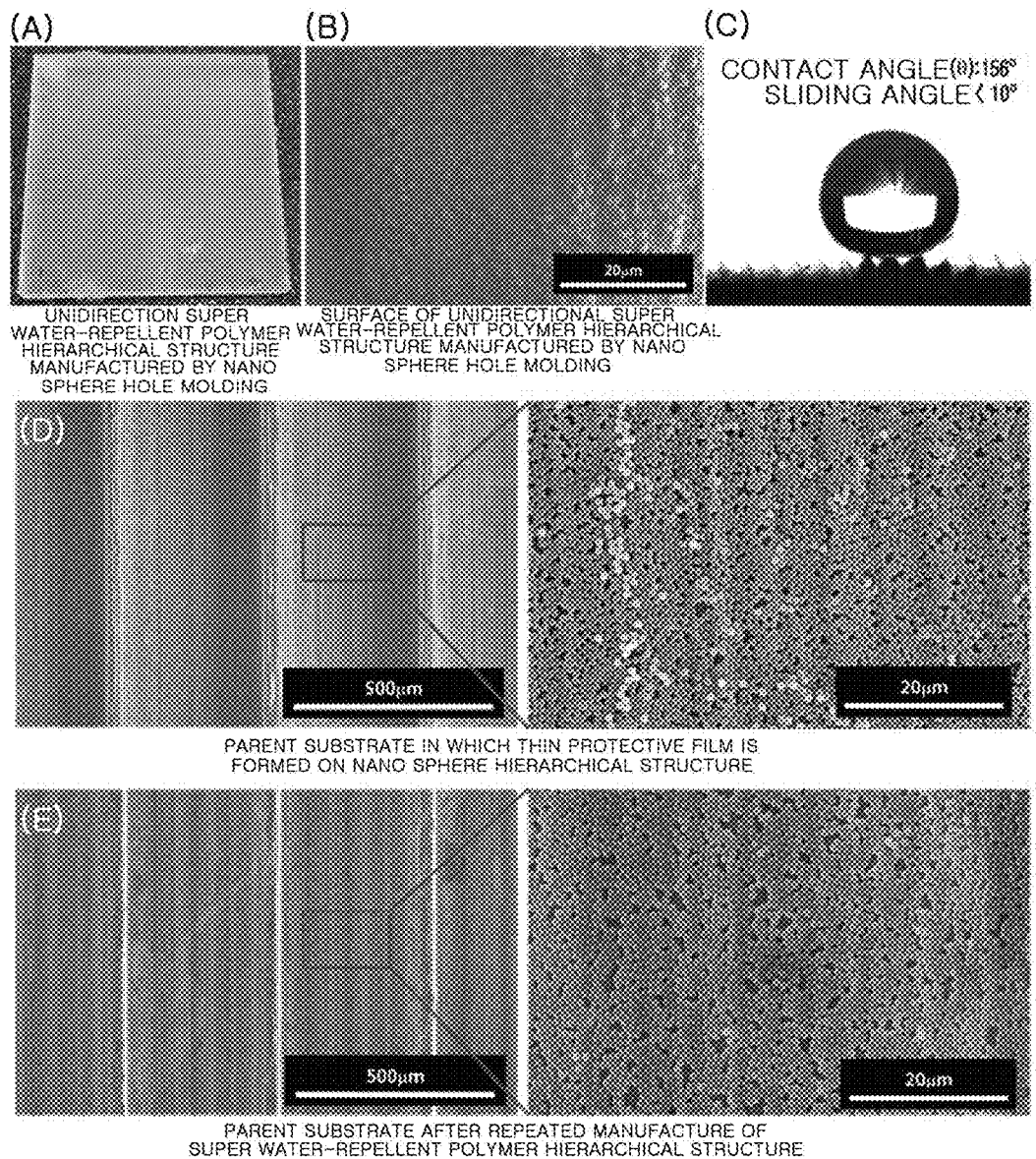

[Fig. 20]
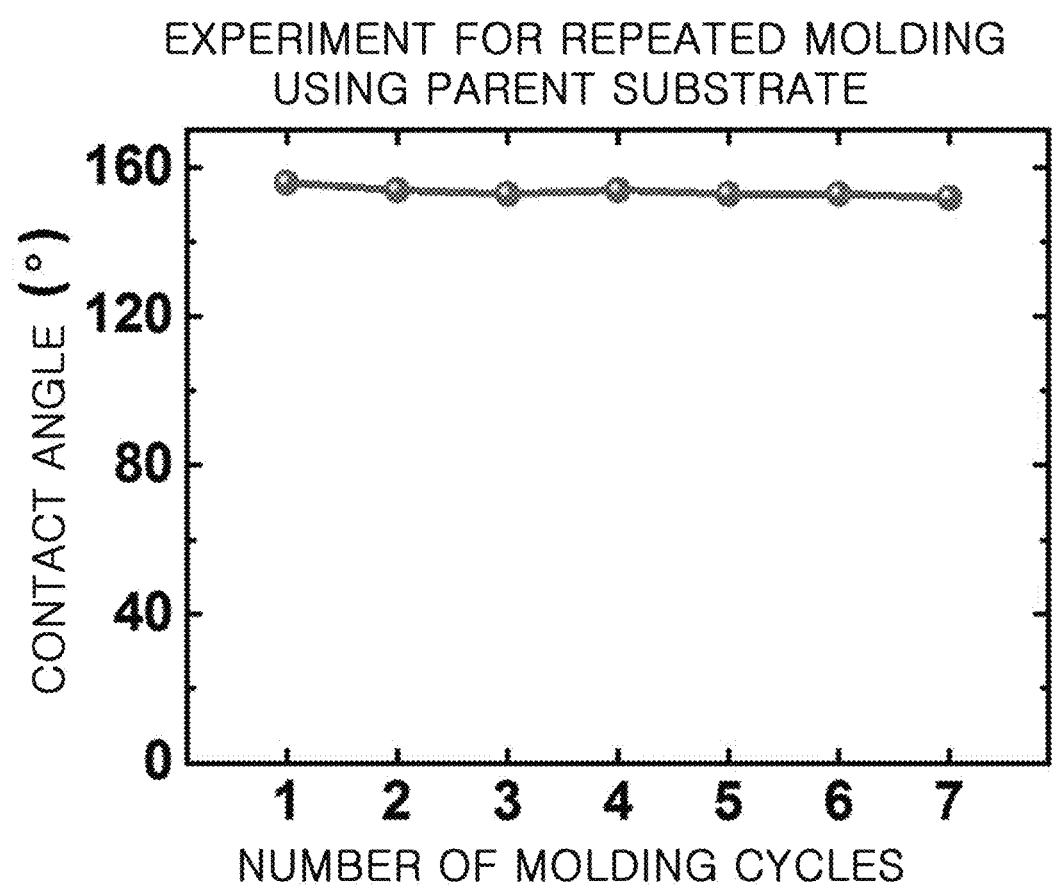

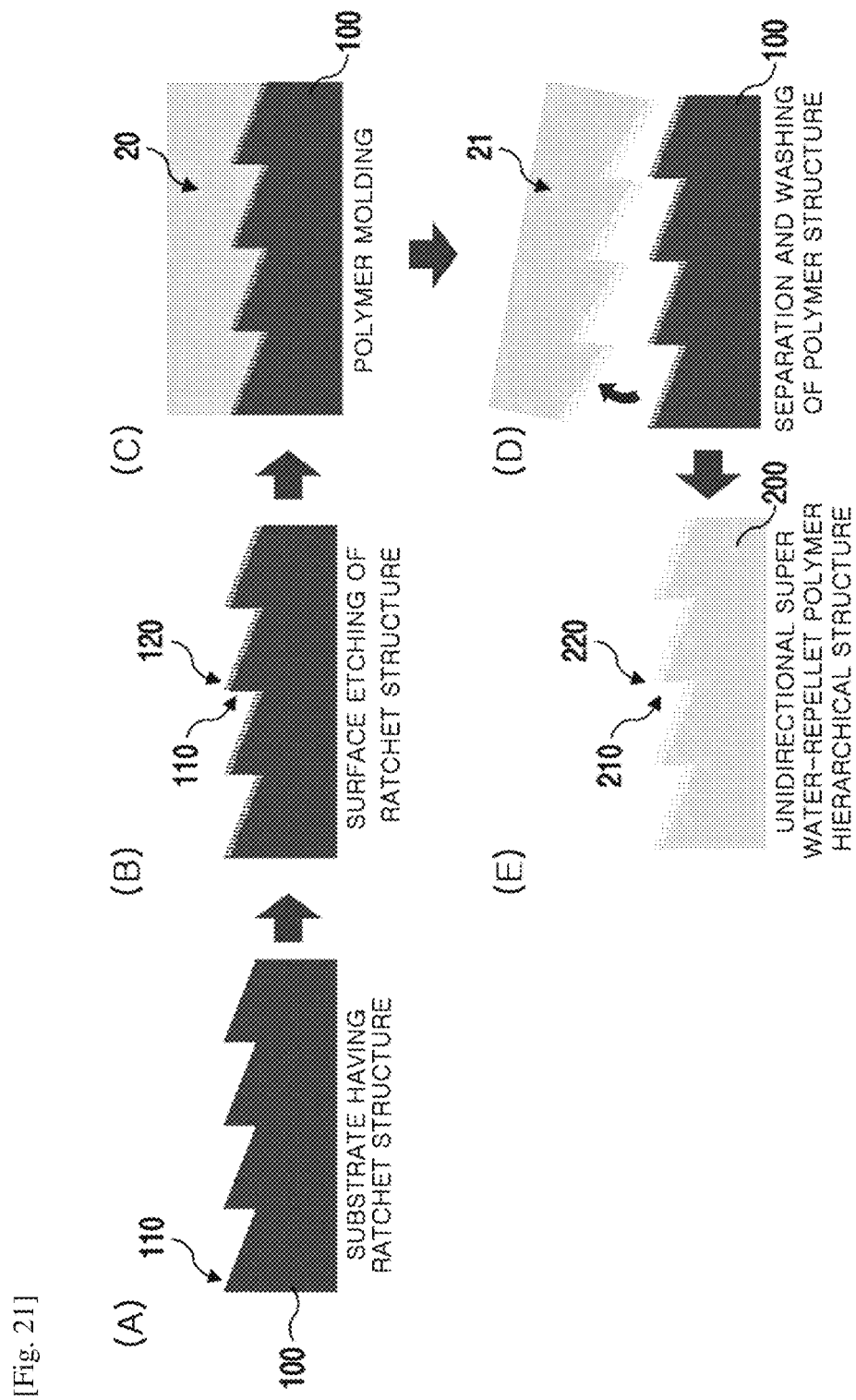

[Fig. 22]
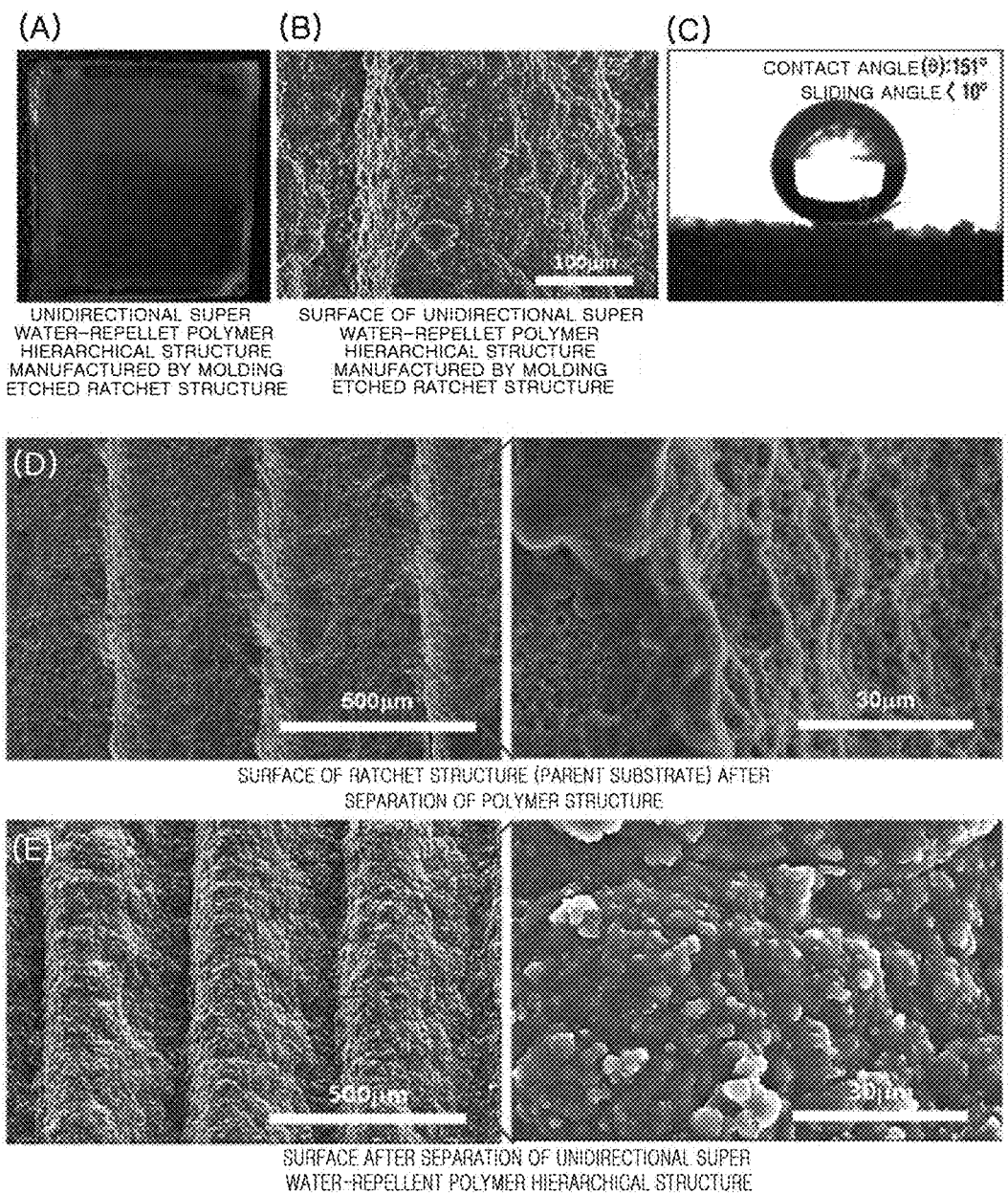

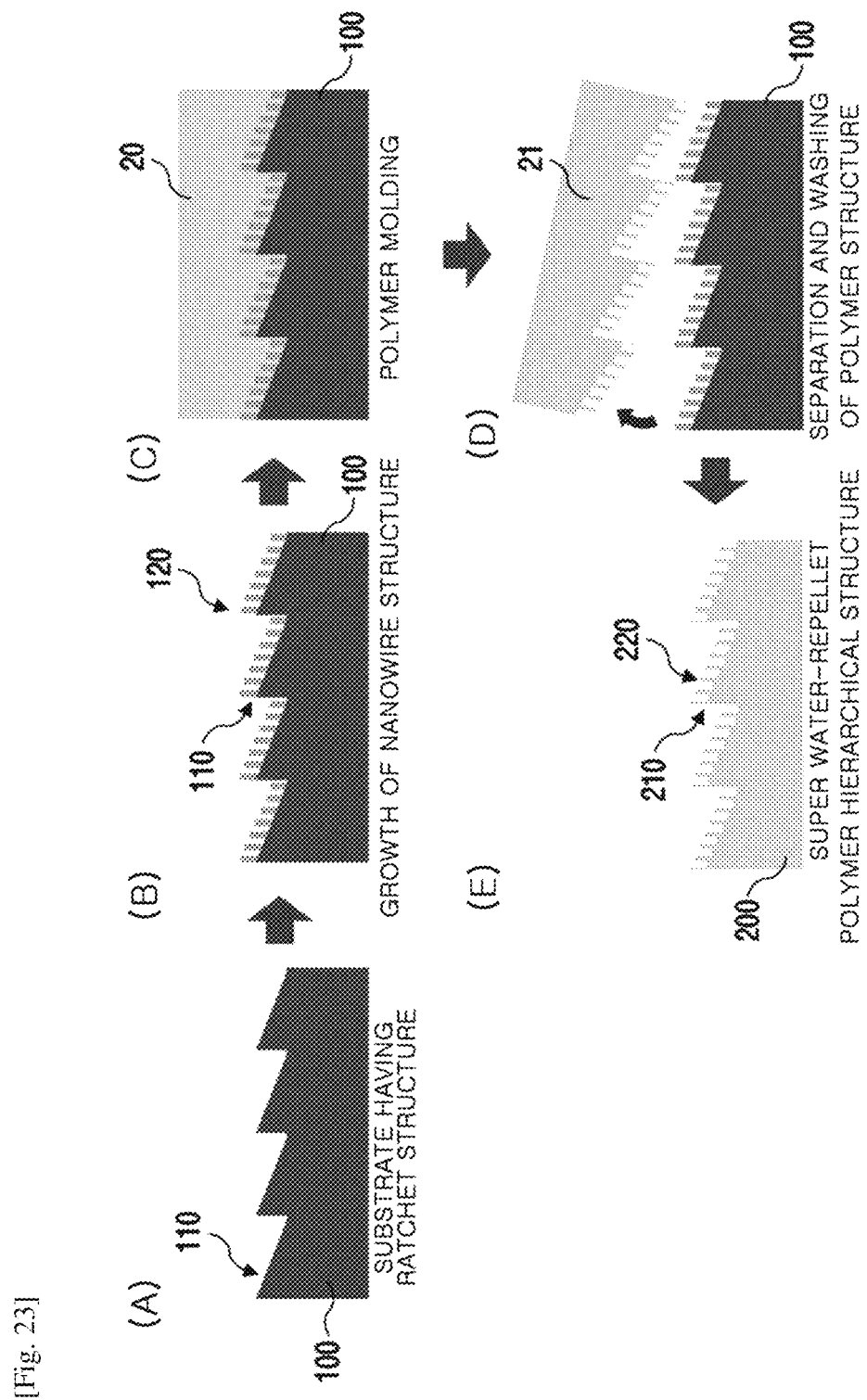

[Fig. 24]
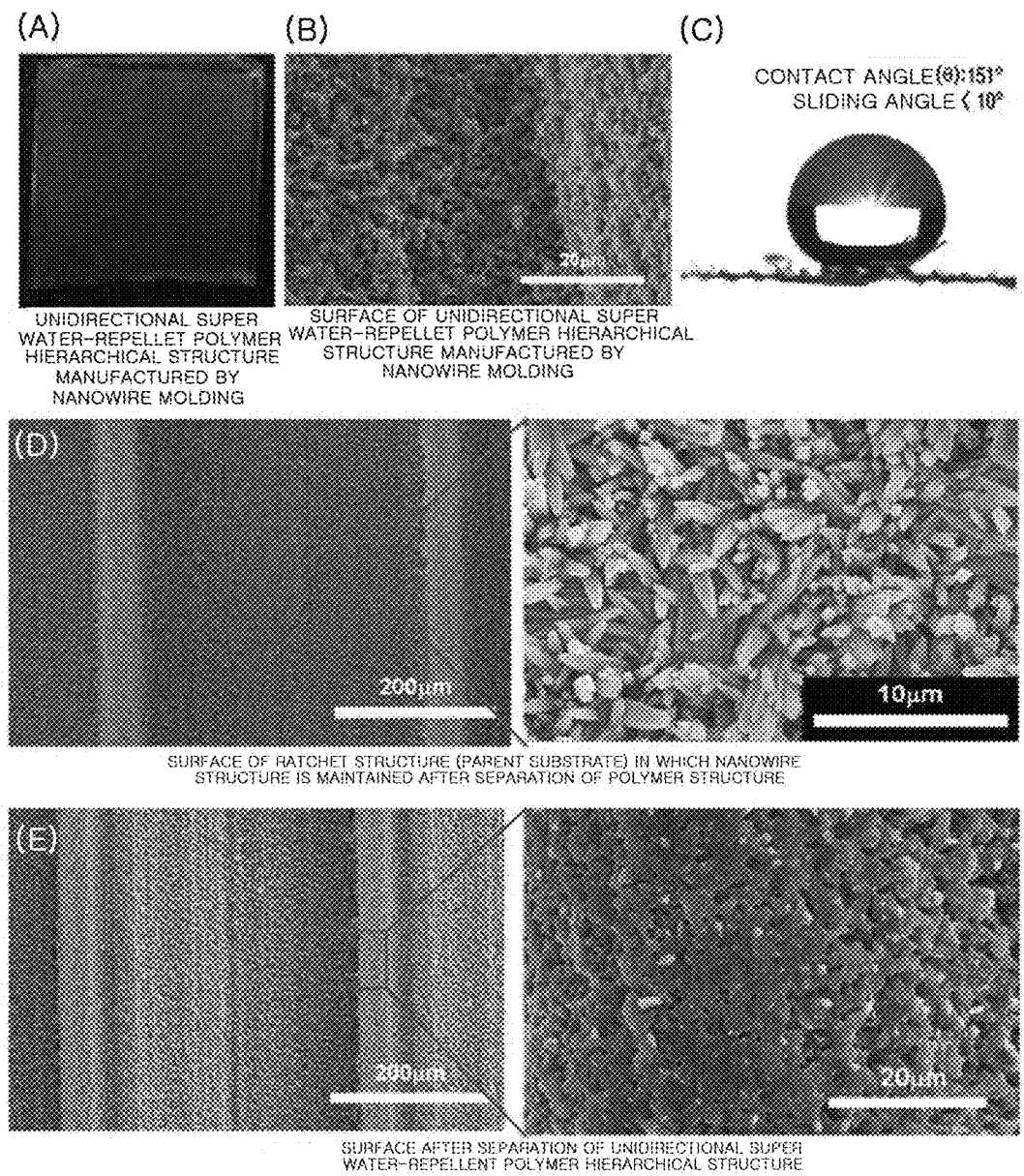

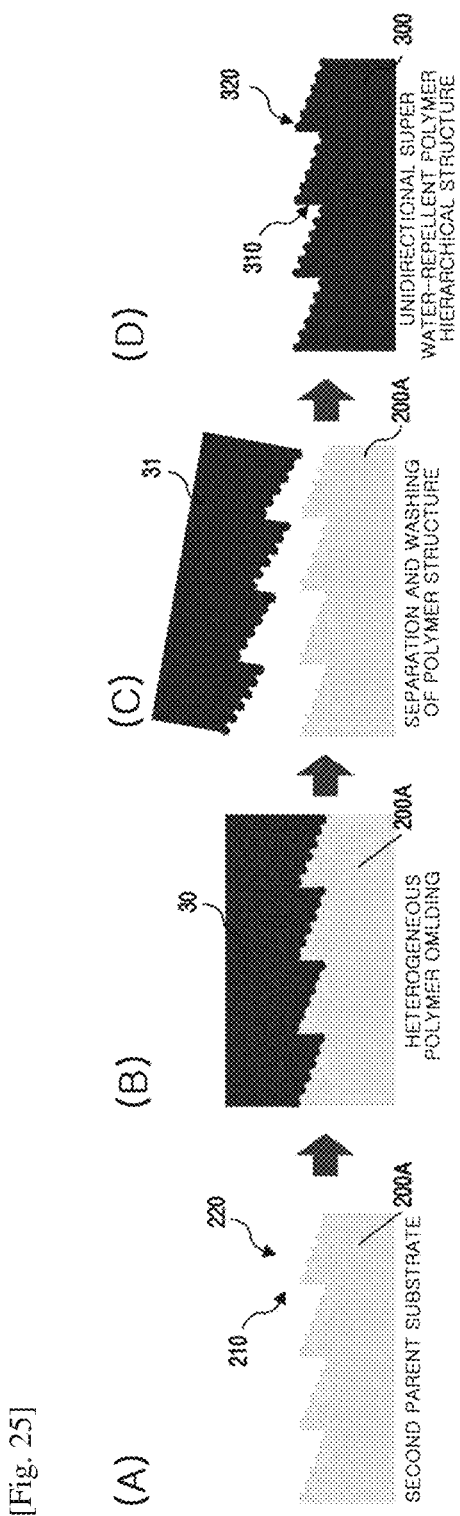

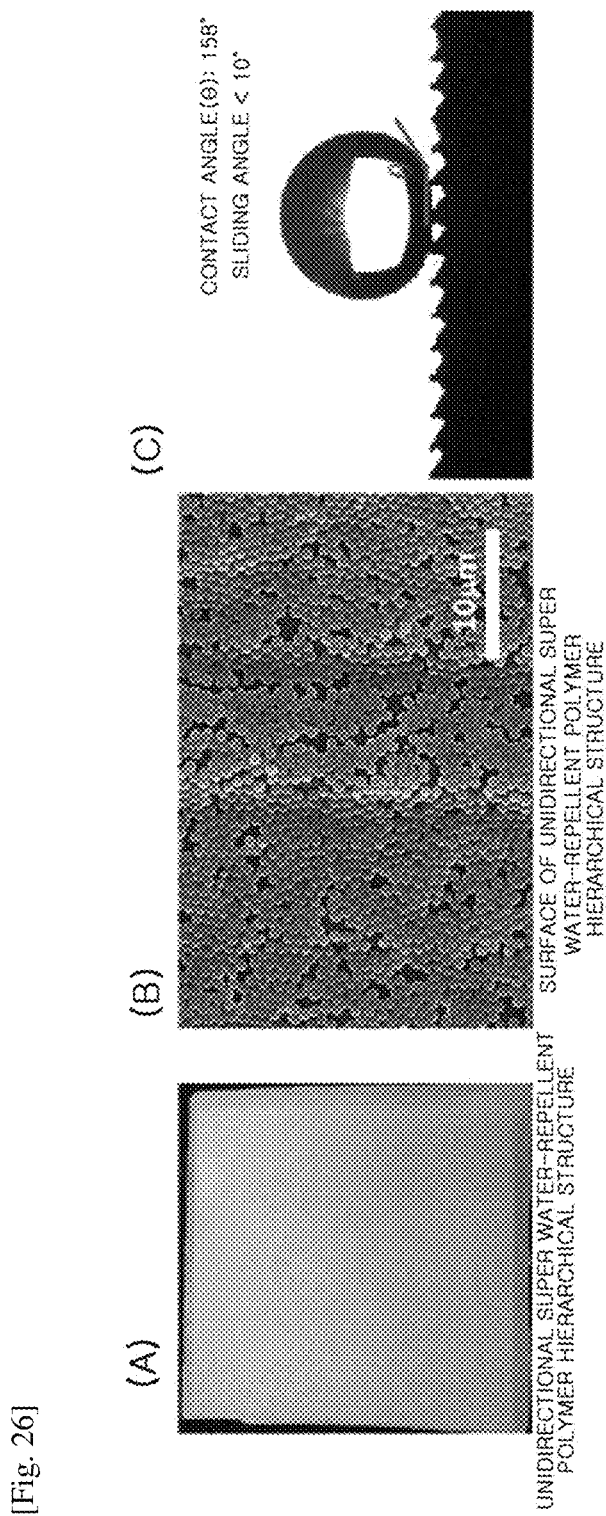
[Fig. 26]

[Fig. 27]
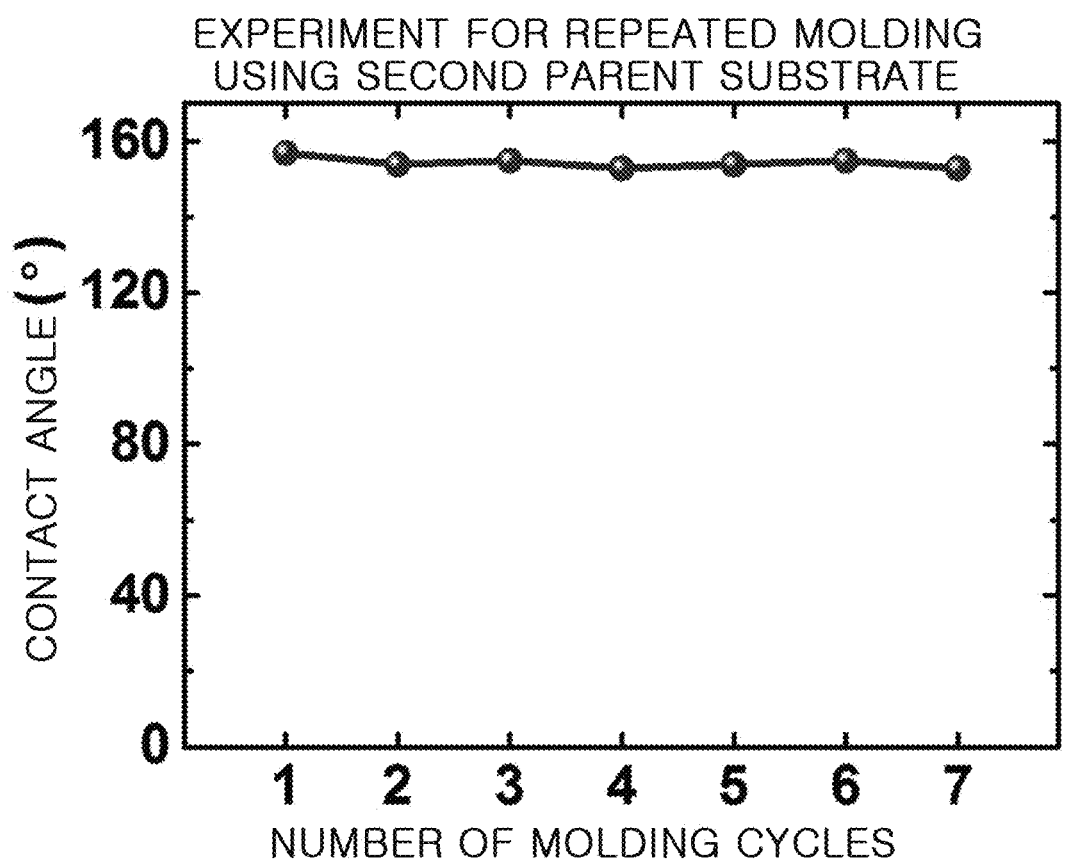

[Fig. 28]
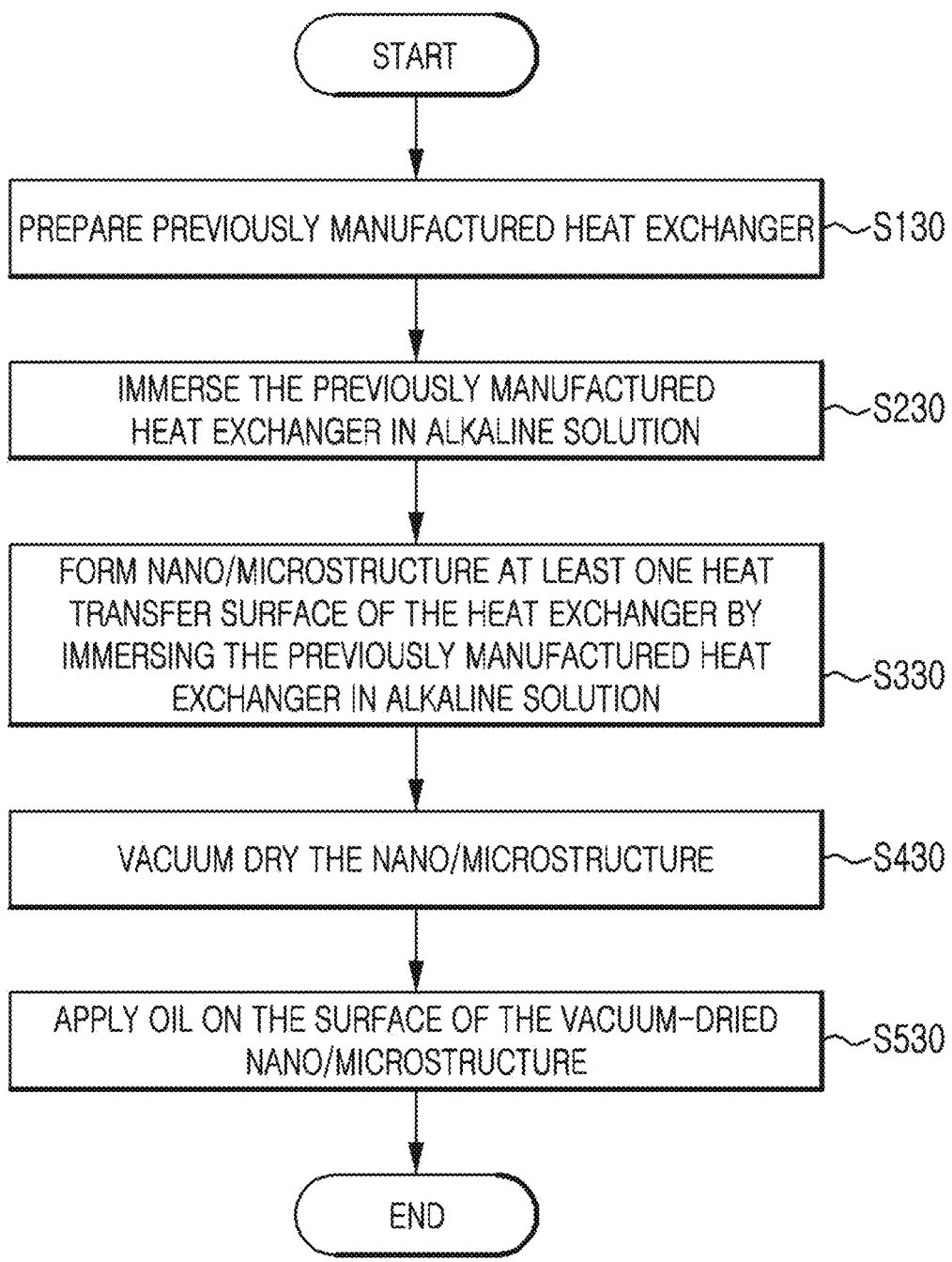

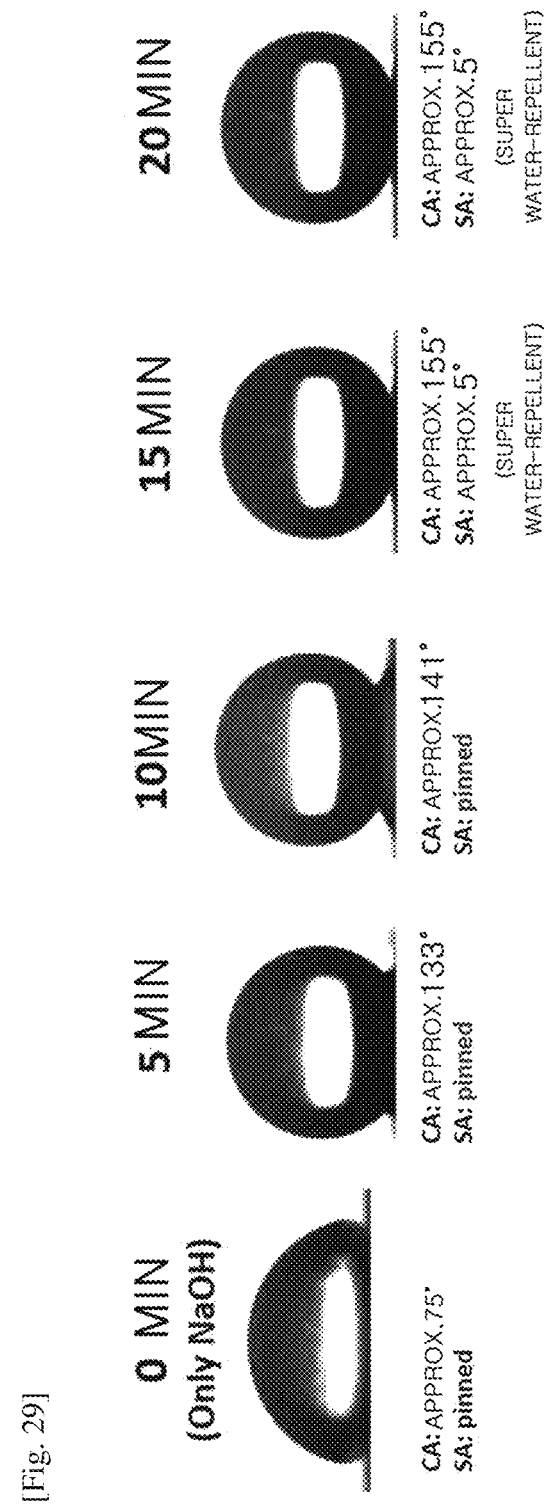
[Fig. 29]

[Fig. 30]
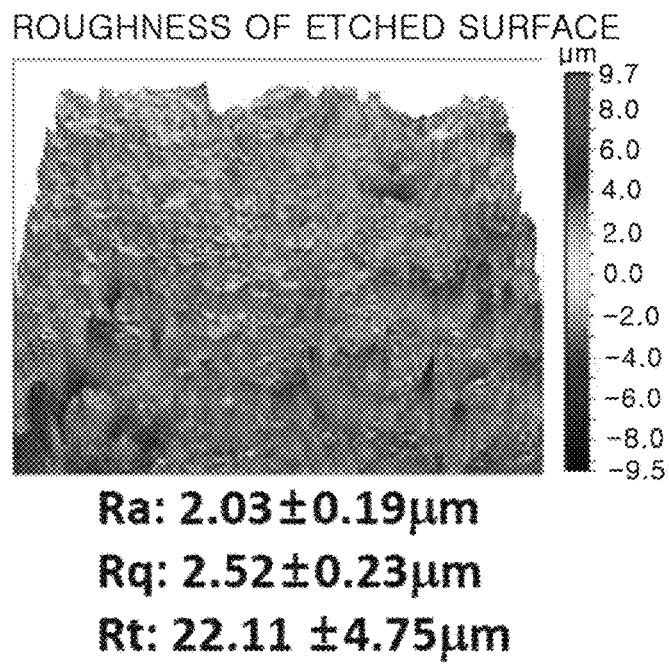
Ra: 2.03±0.19μm
Rq: 2.52±0.23μm
Rt: 22.11 ±4.75μm
[Fig. 31]
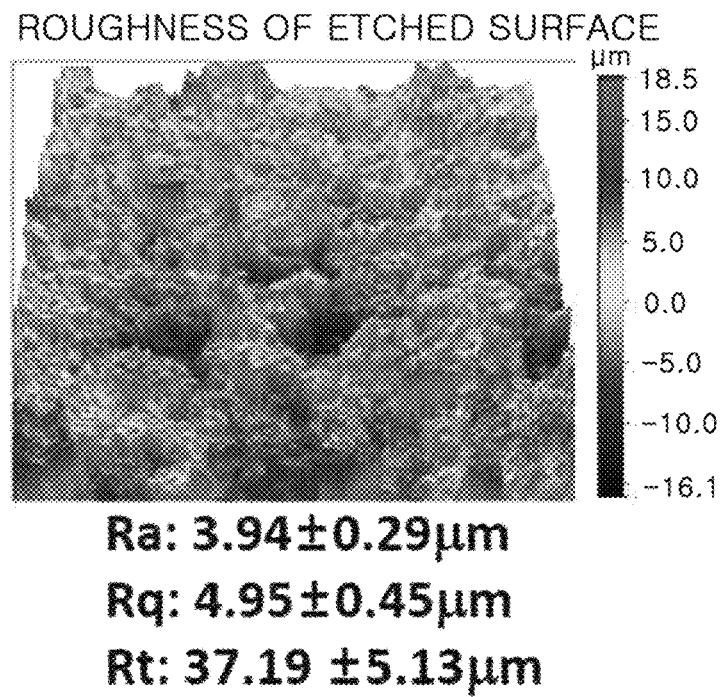
Ra: 3.94±0.29μm
Rq: 4.95±0.45μm
Rt: 37.19 ±5.13μm

[Fig. 32]
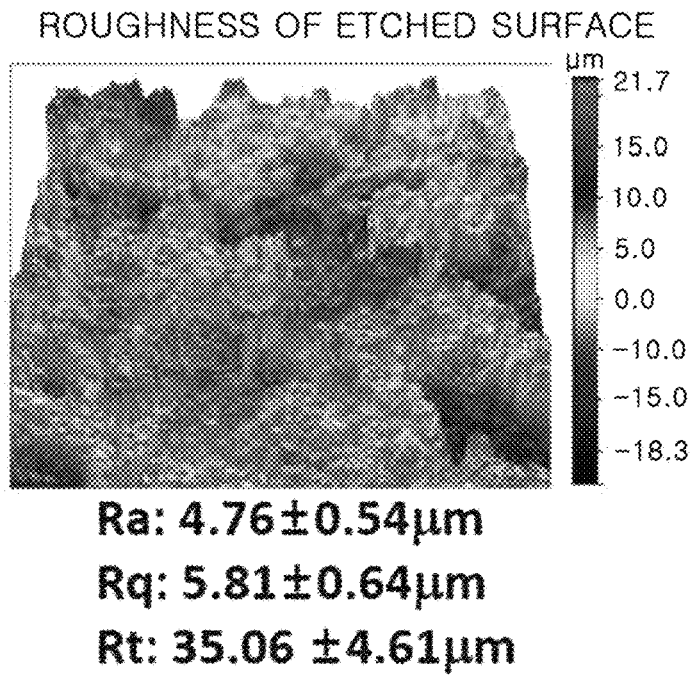
Ra: 4.76±0.54μm
Rq: 5.81±0.64μm
Rt: 35.06 ±4.61μm
[Fig. 33]
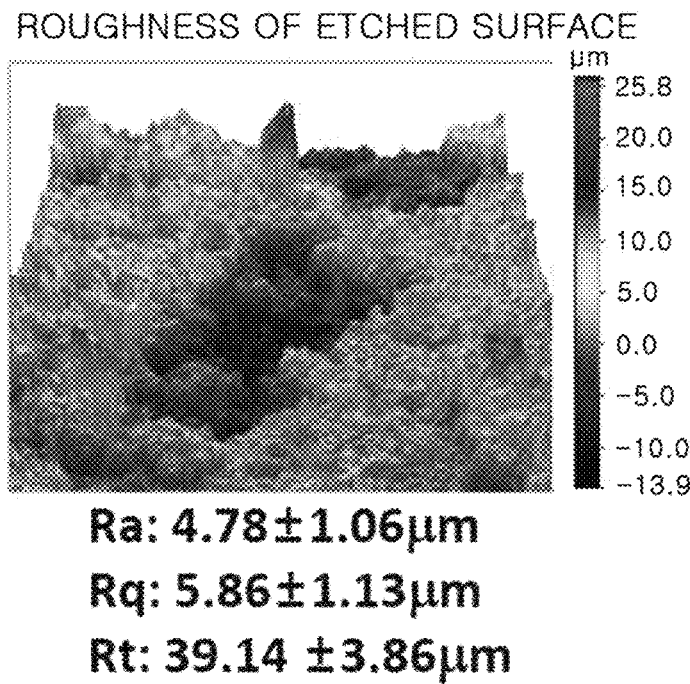
Ra: 4.78±1.06μm
Rq: 5.86±1.13μm
Rt: 39.14 ±3.86μm

[Fig. 34]
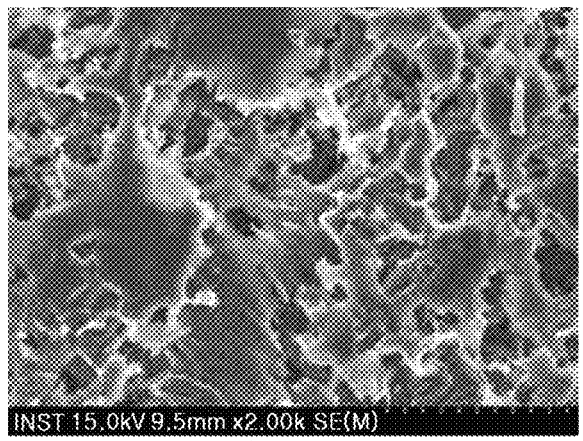
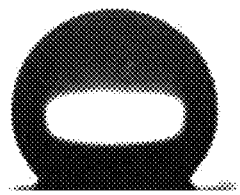
CA: APPROX. 133°
SA: pinned
[Fig. 35]
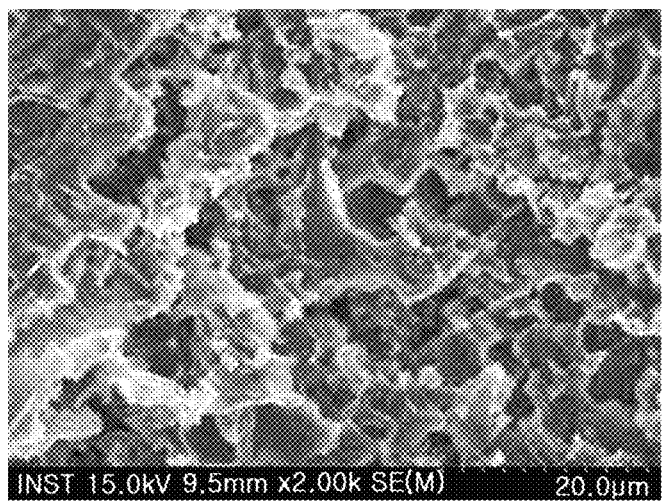
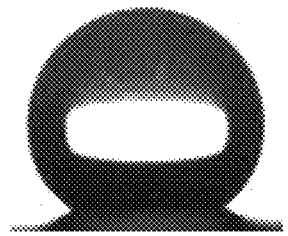
CA: APPROX. 141°
SA: pinned

[Fig. 36]
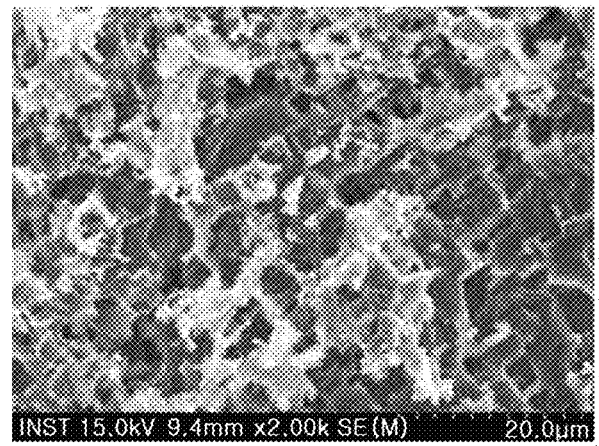
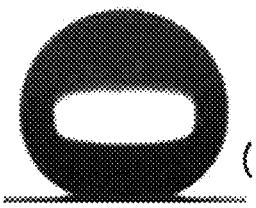
CA: APPROX. 155°
SA: APPROX. 5°
(SUPER WATER-REPELLENT)
[Fig. 37]
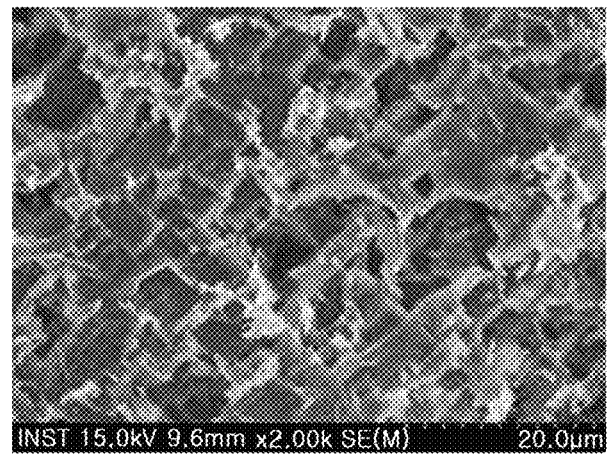
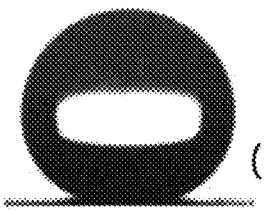
CA: APPROX. 155°
SA: APPROX. 5°
(SUPER WATER-REPELLENT)

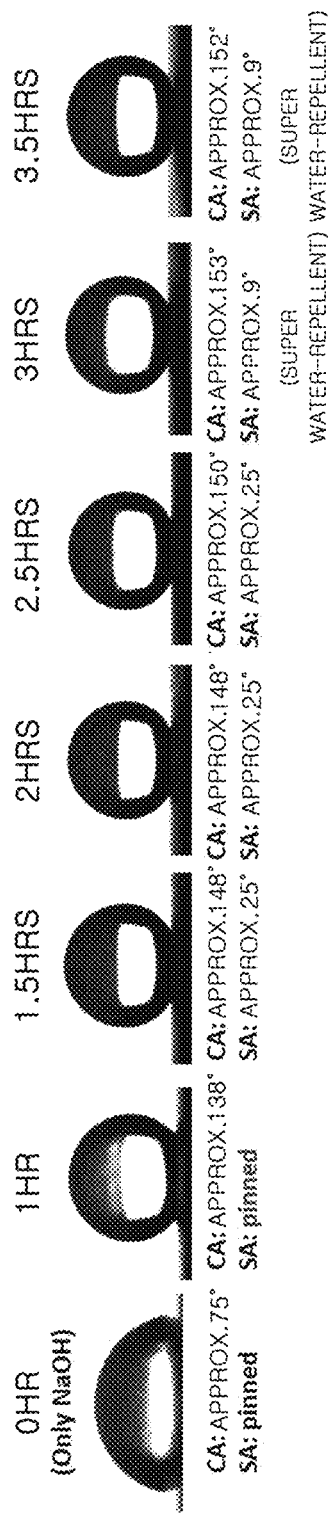
[Fig. 38]

[Fig. 39]

| 0 MIN (Only NaOH) | 1 MIN | 2 MIN | 3 MIN | 4 MIN | 5 MIN | 6 MIN |
|---|---|---|---|---|---|---|
| CA: APPROX.75° SA: pinned | CA: APPROX.116° SA: pinned | CA: APPROX.132° SA: pinned | CA: APPROX.150° SA: APPROX.25° | CA: APPROX.156° SA: APPROX.5° (SUPER WATER-REPELLENT) | CA: APPROX.154° SA: APPROX.5° (SUPER WATER-REPELLENT) | CA: APPROX.156° SA: APPROX.5° (SUPER WATER-REPELLENT) |

[Fig. 40]
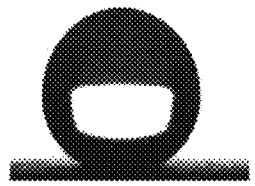
CA: APPROX. 154°
SA: APPROX. 5°
[Fig. 41]
CA: APPROX. 75°
SA: pinned
[Fig. 42]
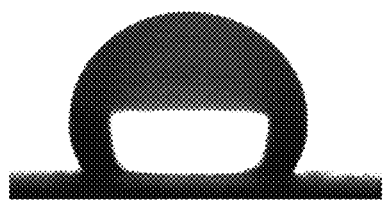
CA: APPROX. 116°
SA: APPROX. 9°
[Fig. 43]
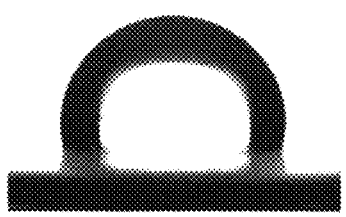
CA: APPROX. 103°
SA: pinned

SUPER WATER REPELLENT POLYMER HIERARCHICAL STRUCTURE, HEAT EXCHANGER HAVING SUPER WATER REPELLENCY, AND MANUFACTURING METHOD THEREFOR

CROSS REFERENCE TO RELATED APPLICATIONS

This application is a National Stage of International Application No. PCT/KR2015/007593, filed on Jul. 22, 2015, which claims priority from Korea Patent Application Nos. 10-2014-0115489, filed on Sep. 1, 2014, 10-2014-0116094, filed on Sep. 2, 2014, and 10-2015-0068588, filed on May 18, 2015, the contents of all of which are incorporated herein by reference in their entirety.

TECHNICAL FIELD

The present invention relates to a super water-repellent polymer hierarchical structure and a method for manufacturing the same, and more particularly, to a super water-repellent polymer hierarchical structure, which minimizes a sliding angle, and a method for manufacturing the same.

The present invention also relates to a heat exchanger, and more particularly, to a heat exchanger having super water-repellency and a method for manufacturing the same.

BACKGROUND ART

Recently studied technology for moving droplets in one direction, that started from the biomimicry of butterfly wings, spider webs, cactus spines, etc., is technology that has attracted attention in water harvesting, steam condensate drainage in a heat exchanger or the like, or the microfluidics industry.

However, up to now, to move droplets in one direction, a nano or micro-scale structure for helping droplets to move in one direction was manufactured on the surface of a material and tilted and the droplets rolled down in one direction. Alternatively, droplets were able to roll down in one direction by applying an external force exerted by a magnetic field, vibration, or the like.

In Korean Unexamined Patent Application Publication No. 10-2010-0011213 (Feb. 3, 2010), a method for manufacturing a material having a super hydrophobic surface and a super hydrophobic material prepared thereby are disclosed, but a structure capable of moving droplets in on direction without an external force while the surface of the structure is barely tilted has not been disclosed.

Meanwhile, research on super water-repellent technology that started from the biomimicry of butterfly wings, spider webs, cactus spines, etc. has been applied to various materials such as polymers as well as a metal surface in water harvesting or kitchen appliances requiring steam condensate drainage and self-cleaning, and has attracted attention in the microfluidics, aviation and automobile industries, etc.

Until now, to realize the super water-repellency of a polymer material, a water-repellent coating has been used on the polymer, or a nano/microstructure has been directly etched or deposited on the polymer.

However, such methods had difficulty in commercialization due to difficulty in large-scale implementation, a high production cost, etc. Such problems became larger in super water-repellent applications (unidirectional steam condensate drainage, etc.) where regular arrangement of the structures is essential.

On the other hand, the heat transfer performance of the heat exchanger may depend greatly on the wettability of a heat transfer surface with respect to water.

For example, condensation and frosting phenomena occur on the heat transfer surface of the heat exchanger which is applied to a freezer, an air conditioner, a heat pump, etc. To minimize the reduction in efficiency due to the above phenomena, research has been actively carried out to enhance the efficiency of the heat exchanger through the induction of dropwise condensation or the increase in frosting delay, which is caused by water repellency or super water-repellency on the heat transfer surface, which is achieved by manufacturing the nano/micro structure on the heat transfer surface of the heat exchanger through etching, and performing fluoro- or silane-based water repellent or super water-repellent coating by chemical vapor deposition, electrochemical deposition or dip coating.

However, previous research was mostly directed to the dropwise condensation and frosting delay effects achieved by the increase in a contact angle, and research on steam condensate drainage which is important for the enhancement of heat exchanger efficiency is rarely carried out. In addition, since it is difficult to maximize a contact angle for increasing the above-mentioned effects only with a coating material, it is necessary to additionally form a nano/micro structure on the heat transfer surface. However, since the previous research has a limitation in that a process for manufacturing a nano/micro structure cannot be directly applied to a heat exchanger having a complicated shape, which has been already manufactured, the nano/micro structure was manufactured on each part constituting the heat exchanger, and then a water repellent or super water-repellent heat exchanger was manufactured eventually by assembling the individual parts. For example, in Japanese Unexamined Patent Application, First Publication No. H6-307793 (Nov. 1, 1994), submicron-scale micro-irregularities were previously formed on the heat transfer surface facing air, and a nanometer-scale thin film of a branched fluorocarbon-based monolayer was formed on the irregularities for water repellent treatment.

As described above, the previous research has several limitations.

First, even when the dropwise condensation and the frosting delay occurs due to the increase in a contact angle of the heat transfer surface of the heat exchanger, a steam condensate generated on the heat transfer surface was difficult to drain during frosting or defrosting due to a phenomenon in which condensed liquid droplets are attached to the heat transfer surface. Therefore, as frosting/defrosting cycles were repeated, heat transfer performance decreased, and thus a pre-existing heat exchanger was difficult to be practically applied to the heat exchanger industry.

Second, water repellency or super water-repellency is caused by low surface energy and the formation of the nano/micro structure, but the water repellent coating and the nano/micro structure, which can be formed on parts of the heat exchanger to obtain the low surface energy, inherently have low resistance to heat and low mechanical strength. Therefore, due to force or heat applied during the assembly of the individual parts of the heat exchanger, a water repellent coating or a nano/micro structure formed on each part may be damaged, and therefore water repellency or super water-repellency may be considerably degraded.

Third, since the parts of the heat exchanger had to be assembled after water repellency or super water-repellency was realized on each part of the heat exchanger, the process became complicated, and thus much money and time were consumed.

DISCLOSURE

Technical Problem

An object of the present invention is to provide a super water-repellent polymer hierarchical structure which minimizes a sliding angle and a method for manufacturing the same.

Another object of the present invention is to provide a heat exchanger with super water-repellency, which is enhanced in heat transfer efficiency, and a method for manufacturing the same.

Still another object of the present invention is to provide a heat exchanger with super water-repellency, which can efficiently remove droplets generated on a heat transfer surface of the heat exchanger, and a method for manufacturing the same.

Technical Solution

To achieve the above-mentioned objects, one aspect of the present invention provides a method for manufacturing a super water-repellent polymer hierarchical structure. The method for manufacturing a super water-repellent polymer hierarchical structure includes: forming parent substrate which has a ratchet structure on the upper surface thereof and a super water-repellent nano structure formed on the ratchet structure; applying a liquid polymer on the parent substrate; curing the applied liquid polymer; and separating the cured polymer from the parent substrate, and the polymer separated from the parent substrate has a sliding angle of less than 10 degrees.

The parent substrate may be a metal substrate, a ceramic substrate, or a polymer substrate.

In addition, the forming of a parent substrate may include forming a ratchet structure on the upper surface of a substrate and forming a super water-repellent nano structure on the ratchet structure.

The super water-repellent nano structure used herein is a super water-repellent nanowire structure, and may be formed on the ratchet structure by a hydrothermal synthesis method.

The ratchet structure is characterized by the conditions in which an absolute value of $W_2-W_1$ is 50 degrees or more, and a height of a constituent triangle of the ratchet structure ranges from 100 to 400 μm, wherein $W_1$ may be one of the two lower angles of the constituent triangle of the ratchet structure, and $W_2$ may be the other of the two lower angles of the constituent triangle of the ratchet structure.

In addition, the super water-repellent nano structure may be a nanowire structure or a nano hole structure.

In addition, the liquid polymer may be polydimethylsiloxane (PDMS), polymethylmethacrylate (PMMA), polypropylene (PP), polyurethane (PU), polyethylene (PE), polyvinylidene fluoride (PVDF) or polyethersulfone (PES).

To achieve the above-mentioned objects, another aspect of the present invention provides a method for manufacturing a super water-repellent polymer hierarchical structure. Such a method for manufacturing a super water-repellent polymer hierarchical structure includes forming a parent substrate having a ratchet structure formed on the upper surface thereof; applying a liquid polymer on the parent substrate; curing the applied liquid polymer; separating the cured polymer from the parent substrate; and forming the super water-repellent nano structure on the ratchet structure formed on the surface of the separated polymer, wherein the polymer on which the super water-repellent nano structure is formed has a sliding angle of less than 10 degrees.

The super water-repellent nano structure is a nanowire or nano sphere structure.

In addition, when the super water-repellent nano structure is a nanowire structure, the super water-repellent nano structure is formed on the ratchet structure formed on the surface of the separated polymer by a hydrothermal synthesis method.

To achieve the above-mentioned objects, another aspect of the present invention provides a method for manufacturing a polymer hierarchical structure. Such a method for manufacturing a polymer hierarchical structure includes forming a first parent substrate having a ratchet structure on the upper surface thereof, applying a liquid polymer on the first parent substrate, curing the applied liquid polymer, forming a second parent substrate by separating the cured polymer from the first parent substrate, applying a liquid heterogeneous polymer to the second parent substrate, curing the applied liquid heterogeneous polymer, separating the cured heterogeneous polymer from the second parent substrate, and forming a super water-repellent nano structure on the ratchet structure formed on the surface of the separated heterogeneous polymer, wherein the heterogeneous polymer on which the super water-repellent nano structure is formed has a sliding angle of less than 10 degrees.

To achieve the above-mentioned objects, still another aspect of the present invention provides a method for manufacturing a super water-repellent polymer hierarchical structure. Such a method for manufacturing a super water-repellent polymer hierarchical structure includes forming a first parent substrate having a ratchet structure formed on the upper surface thereof and a super water-repellent nano structure formed on the ratchet structure, applying a liquid polymer on the first parent substrate, curing the applied liquid polymer, forming a second parent substrate by separating the cured polymer from the first parent substrate, applying a liquid heterogeneous polymer on the second parent substrate, curing the applied liquid heterogeneous polymer, and separating the cured heterogeneous polymer from the second parent substrate, wherein the separated heterogeneous polymer has a sliding angle of less than 10 degrees.

The ratchet structure is characterized by the conditions in which an absolute value of $W_2-W_1$ is 50 degrees or more, and a height of a constituent triangle of the ratchet structure ranges from 100 to 400 μm, wherein $W_1$ may be one of the two lower angles of the constituent triangle of the ratchet structure, and $W_2$ may be the other of the two lower angles of the constituent triangle of the ratchet structure.

To achieve the above-mentioned objects, yet another aspect of the present invention provides a super water-repellent polymer hierarchical structure. Such a super water-repellent polymer hierarchical structure may be manufactured by the above-described methods for manufacturing a super water-repellent polymer hierarchical structure.

To achieve the above-mentioned objects, yet another aspect of the present invention provides a method for manufacturing a super water-repellent polymer hierarchical structure. The method for manufacturing a super water-repellent polymer hierarchical structure includes forming a parent substrate having a ratchet structure formed on the upper surface thereof and a super water-repellent nano structure formed on the ratchet structure, forming a protective layer for preventing the detachment of the super water-repellent nano structure on the super water-repellent nano structure, applying a liquid polymer on the parent substrate, curing the applied liquid polymer, and separating the cured polymer from the parent substrate and washing the separated polymer, wherein the polymer separated from the parent substrate has a sliding angle of less than 10 degrees.

In addition, the parent substrate may be a metal substrate, a ceramic substrate or a polymer substrate.

In addition, the forming of a parent substrate may include forming a ratchet structure on the upper surface of a substrate, and forming a super water-repellent nano structure on the ratchet structure.

In addition, the ratchet structure is characterized by the conditions in which an absolute value of $W_2-W_1$ is 50 degrees or more, and a height of a constituent triangle of the ratchet structure ranges from 100 to 400 μm, wherein $W_1$ may be one of the two lower angles of the constituent triangle of the ratchet structure, and $W_2$ may be the other of the two lower angles of the constituent triangle of the ratchet structure.

In addition, the super water-repellent nano structure may be a nanowire structure, a nano sphere structure or a nano hole structure.

In addition, the forming of a super water-repellent nano structure on the ratchet structure is performed with a hydrothermal synthesis method, a chemical solution etching method or a nano structure applying method.

In addition, the protective layer may have a thickness of 20 to 300 nm.

In addition, the protective layer may include a metallic material or a polymer material. Here, the metallic material of the protective layer may include aluminum (Al), gold (Au) or platinum (Pt). In addition, the polymer material of the protective layer may include polydimethylsiloxane (PDMS), polymethylmethacrylate (PMMA), polyethylene (PE), polyvinylidene fluoride (PVDF) or polyethersulfone (PES).

In addition, the liquid polymer may include polydimethylsiloxane (PDMS), polymethylmethacrylate (PMMA), polypropylene (PP), polyurethane (PU), polyethylene (PE), polyvinylidene fluoride (PVDF), polytetrafluorethylene (PTFE) or polyethersulfone (PES).

To achieve the above-mentioned objects, yet another aspect of the present invention provides a method for manufacturing a super water-repellent polymer hierarchical structure. The method for manufacturing a super water-repellent polymer hierarchical structure includes forming a first parent substrate having a ratchet structure formed on the upper surface thereof and a super water-repellent nano structure formed on the ratchet structure, forming a protective layer for preventing the detachment of the super water-repellent nano structure on the super water-repellent nano structure, applying a liquid polymer on the first parent substrate, curing the applied liquid polymer, forming a second parent substrate by separating the cured polymer from the first parent substrate and washing the separated polymer, applying a liquid heterogeneous polymer on the second parent substrate, curing the applied liquid heterogeneous polymer, and separating the cured heterogeneous polymer from the second parent substrate and washing the separated polymer, wherein the separated heterogeneous polymer has a sliding angle of less than 10 degrees.

In addition, the ratchet structure is characterized by the conditions in which an absolute value of $W_2-W_1$ is 50 degrees or more, and a height of a constituent triangle of the ratchet structure ranges from 100 to 400 μm, wherein $W_1$ may be one of the two lower angles of the constituent triangle of the ratchet structure, and $W_2$ may be the other of the two lower angles of the constituent triangle of the ratchet structure.

In addition, the protective layer may have a thickness of 20 to 300 nm.

In addition, the protective layer may include a metallic material or a polymer material. Here, the metallic material of the protective layer may include aluminum (Al), gold (Au), or platinum (Pt). In addition, the polymer material of the protective layer may include polydimethylsiloxane (PDMS), polymethylmethacrylate (PMMA), polyethylene (PE), polyvinylidene fluoride (PVDF) or polyethersulfone (PES).

To achieve the above-mentioned objects, yet another aspect of the present invention provides a super water-repellent polymer hierarchical structure. Such a super water-repellent polymer hierarchical structure may be manufactured by the above-described methods for manufacturing a super water-repellent polymer hierarchical structure.

To achieve the above-mentioned objects, yet another aspect of the present invention provides a method for manufacturing a heat exchanger having super water-repellency. The method for manufacturing a heat exchanger having super water-repellency may include preparing a pre-manufactured heat exchanger, forming a nano/micro structure on at least a heat transfer surface of the heat exchanger by immersing the pre-manufactured heat exchanger in an etching solution, and vacuum drying the formed nano/micro structure.

In addition, between the preparing of a pre-manufactured heat exchanger and the forming of a nano/micro structure, immersing the pre-manufactured heat exchanger in an alkaline solution may be further included. Here, the immersing of the pre-manufactured heat exchanger in an alkaline solution is characterized by removing a native oxide film on at least the heat transfer surface of the heat exchanger. Such an alkaline solution may include NaOH.

In addition, the etching solution may include a dilute chloride solution.

In addition, the vacuum drying of the formed nano/micro structure is characterized by performing drying in a vacuum atmosphere of 0.1 to 1 Torr at a temperature of 150 to 180° C. for 1 to 2 hours.

On the other hand, after the vacuum drying of the formed nano/micro structure, applying oil on a surface of the vacuum-dried nano/micro structure may be further included. Here, the oil may be fluorinated oil. Thus, the applying of such oil may be characterized by penetrating the oil between nano/micro structures to reduce the adhesive strength of droplets.

To achieve the above-mentioned objects, yet another aspect of the present invention provides a heat exchanger having super water-repellency.

Such a heat exchanger having super water-repellency includes a heat transfer surface and a nano/micro structure formed on a surface at least including the heat transfer surface, wherein the nano/micro structure is coated with oil.

Here, hydrophilic ions may be removed from the surface of the nano/micro structure by vacuum drying.

In addition, the oil used for the application of oil may be fluorinated oil.

In addition, the heat transfer surface on which such a nano/microstructure may have a sliding angle of less than 10 degrees.

Advantageous Effects

According to the present invention, using a ratchet structure and a super water-repellent nano structure, a super water-repellent polymer hierarchical structure that can allow droplets to move in one direction without an externally-applied force, while the surface of the structure is barely tilted, can be provided.

In addition, a super water-repellent polymer hierarchical structure can be simply manufactured by a method of forming a parent substrate which has a ratchet structure formed on the upper surface thereof and a super water-repellent nano structure on the ratchet structure, and mechanically molding a polymer material on the parent substrate.

Moreover, the super water-repellent polymer hierarchical structure can be repeatedly manufactured by repeatedly performing the molding method on the parent substrate.

Since the manufactured super water-repellent polymer hierarchical structure has a sliding angle of almost less than 10 degrees, droplets roll down in one direction without an externally-applied force even when the surface of the structure is barely tilted, and thus the structure will be applied in a variety of industries, including water harvesting, kitchen appliances and drain pipes.

According to the present invention, super water-repellency can be realized in the pre-manufactured heat exchange using an immersion method. In other words, the pre-manufactured heat exchanger is immersed in a solution to etch the heat transfer surface of the heat exchanger, thereby forming a nano/micro structure on the heat transfer surface, and the nano/micro structure is vacuum-dried or additionally coated with oil, and thus the heating exchanger having super water-repellency can be achieved.

Thus, according to the above-described process, first, the super water-repellency can be realized uniformly in the entire region into which the solution can penetrate, and thus the super water-repellent heat exchanger can be easily manufactured by immersing the previously manufactured heat exchanger in the solution. Accordingly, there is no damage to the nano/microstructure or water-repellent coating, which may occur when the individual parts are assembled.

Second, the process uses a solution-based method, and thus can be applied even to a larger area and a complicated shape.

Third, since the pre-manufactured heat exchanger is directly used in the manufacture of a heat exchange having super water-repellency, the process is simple and less expensive and saves time, and thus can be easily applied in the future heat exchanger industry.

Fourth, since dropwise condensation or filmwise condensation occurs on the heat transfer surface of the heat exchanger, when the dropwise condensation occurs on the super water-repellent heat transfer surface, compared to the filmwise condensation, heat transfer performance can be greatly enhanced by minimizing heat resistance due to a steam condensate.

Fifth, since frosting occurs on the heat transfer surface of the heat exchanger, heat transfer resistance is increased due to frost, a pressure loss is generated due to blockage of a flow path, and the efficiency of the heat exchanger is greatly decreased due to a frequently repeated defrosting cycles for eliminating the frost. Therefore, as the heat exchanger having super water-repellency can be manufactured in a simple process, the heat transfer resistance and the pressure loss can be improved, the defrosting cycles can be minimized, and frost can be easily removed during defrosting, resulting in maximized efficiency of the heat exchanger.

As the adhesive strength to droplets is reduced by applying oil onto the nano/micro structure, the heat exchanger can also achieve the enhanced efficiency caused by the above-mentioned effects.

The technical effects of the present invention are not limited to those described above, and other technical effects that are not mentioned herein will be clearly understood by those of ordinary skill in the art with reference to the following descriptions.

DESCRIPTION OF DRAWINGS

FIG. 1 is a flow chart illustrating a method for manufacturing a super water-repellent polymer hierarchical structure according to one embodiment of the present invention.

FIG. 2 illustrates a constituent triangle of a ratchet structure.

FIG. 3 illustrates the principle of forces exerted on a droplet in the ratchet structure.

FIG. 4 is a set of diagrams for illustrating an aluminum substrate having a ratchet structure formed on the upper surface thereof.

FIG. 5 is a set of photographs of the polymer ratchet structure manufactured according to Comparative Example 1 and an image illustrating the result of measuring a contact angle and a sliding angle.

FIG. 6 is a set of schematic cross-sectional views illustrating a method for manufacturing a super water-repellent polymer hierarchical structure according to Preparation Example 2 of the present invention.

FIG. 7 is a set of photographs of the super water-repellent polymer hierarchical structure according to Preparation Example 2 of the present invention and an image illustrating the result of measuring a contact angle and a sliding angle.

FIG. 8 is a set of schematic cross-sectional views illustrating a method for manufacturing a super water-repellent polymer hierarchical structure according to Preparation Example 3 of the present invention.

FIG. 9 is a set of photographs of the super water-repellent polymer hierarchical structure according to Preparation Example 3 of the present invention and an image illustrating the result of measuring a contact angle and a sliding angle.

FIG. 10 is a set of schematic cross-sectional views illustrating a method for manufacturing a super water-repellent polymer hierarchical structure according to Preparation Example 4 of the present invention.

FIG. 11 is a set of photographs of the super water-repellent polymer hierarchical structure according to Preparation Example 4 of the present invention and an image illustrating the result of measuring a contact angle and a sliding angle.

FIG. 12 is a set of schematic cross-sectional views illustrating a method for manufacturing a super water-repellent polymer hierarchical structure according to Preparation Example 5 of the present invention.

FIG. 13 is a set of photographs of the super water-repellent polymer hierarchical structure according to Preparation Example 5 of the present invention and an image illustrating the result of measuring a contact angle and a sliding angle.

FIG. 14 is a set of schematic cross-sectional views illustrating a method for manufacturing a super water-repellent polymer hierarchical structure according to Preparation Example 6 of the present invention.

FIG. 15 is a set of photographs of a super water-repellent polymer hierarchical structure according to Preparation Example 6 of the present invention and an image illustrating the result of measuring a contact angle and a sliding angle.

FIG. 16 is a flow chart illustrating a method for illustrating a super water-repellent polymer hierarchical structure according to another embodiment of the present invention.

FIG. 17 is a flow chart illustrating a super water-repellent polymer hierarchical structure according to still another embodiment of the present invention.

FIG. 18 is a set of schematic cross-sectional views illustrating a method for manufacturing a super water-repellent polymer hierarchical structure according to Preparation Example 7 of the present invention.

FIG. 19 is a set of photographs of the super water-repellent polymer hierarchical structure according to Preparation Example 7 of the present invention and an image illustrating the result of measuring a contact angle and a sliding angle.

FIG. 20 shows the result of measuring a contact angle after the super water-repellent polymer hierarchical structure according to Preparation Example 7 is repeatedly manufactured.

FIG. 21 is a set of schematic cross-sectional views illustrating a method for manufacturing the super water-repellent polymer hierarchical structure according to Preparation Example 8 of the present invention.

FIG. 22 is a set of photographs of the super water-repellent polymer hierarchical structure according to Preparation Example 8 of the present invention and an image illustrating the result of measuring a contact angle and a sliding angle.

FIG. 23 is a set of schematic cross-sectional views illustrating a method for manufacturing a super water-repellent polymer hierarchical structure according to Preparation Example 9 of the present invention.

FIG. 24 is a set of photographs of the super water-repellent polymer hierarchical structure according to Preparation Example 9 of the present invention and an image illustrating the result of measuring a contact angle and a sliding angle.

FIG. 25 is a set of schematic cross-sectional views illustrating a method for manufacturing a super water-repellent polymer hierarchical structure according to Preparation Example 10 of the present invention.

FIG. 26 is a set of photographs of the super water-repellent polymer hierarchical structure according to Preparation Example 10 of the present invention and an image illustrating the result of measuring a contact angle and a sliding angle.

FIG. 27 shows the result of measuring a contact angle after the super water-repellent polymer hierarchical structure according to Preparation Example 10 is repeatedly manufactured.

FIG. 28 is a flow chart illustrating a method for manufacturing a heat exchanger having super water-repellency according to one embodiment of the present invention.

FIG. 29 is a set of images showing measured contact angles and sliding angles of a specimen prepared according to Preparation Example 11.

FIGS. 30 to 33 are images showing the roughness of etched surfaces of the specimen prepared according to Preparation Example 11.

FIGS. 34 to 37 are images of the specimen prepared according to Preparation Example 11 and contact angles and sliding angles thereof.

FIG. 38 is a set of images showing measured contact angles and sliding angles of a specimen prepared according to Preparation Example 12.

FIG. 39 is a set of images showing measured contact angles and sliding angles of a specimen prepared according to Preparation Example 13.

FIG. 40 is an image showing a measured contact angle and sliding angle of a specimen of Preparation Example 14 before the application of oil.

FIG. 41 is an image showing a measured contact angle and sliding angle of the specimen of Preparation Example 14 after the application of oil.

FIG. 42 is an image showing a measured contact angle and sliding angle of a specimen of Comparative Example 2 before the application of oil.

FIG. 43 is an image showing a measured contact angle and sliding angle of a specimen of Comparative Example 2 after the application of oil.

MODES OF THE INVENTION

Hereinafter, examples of the present invention will be described in detail with reference to the accompanying drawings.

The present invention may have various modifications and alternative forms, and specific examples will be illustrated in detail with reference to the accompanying drawings below. However, the present invention is not limited to the particular forms disclosed herein, and rather includes all of modifications, equivalents and substitutions consistent with the spirit of the present invention defined by the claims.

When an element such as a layer, region or substrate is referred to as being present "on" another element, it will be understood that the element may be directly present on another element, or a third element may be present therebetween.

Although the terms "first," "second," etc. may be used to describe various elements, components, regions, layers and/or areas, it is to be understood that such elements, components, regions, layers and/or areas should not be limited by these terms.

In addition, the term "super water-repellency" used herein refers to a water repellent property exhibited when a contact angle is 150 degrees or more, and a sliding angle is 10 degrees or less. Here, the above-described contact angle refers to the angle where a stationary liquid surface is in contact with a solid wall, that is, the angle between the liquid surface and a solid surface. In addition, the above-described sliding angle refers to the angle of inclination with respect to a level bottom surface, at which a liquid starts to flow.

Moreover, the term "having super water-repellency" may include the case in which a sliding angle is 10 degrees or less regardless of the above-described contact angle.

Further, the term "nano/micro structure" described throughout the specification refers to a crystalline body including crystals with an average particle diameter of several nanometers to several micrometers.

In addition, the term "heat exchanger" refers to an apparatus or device for exchanging thermal energy between different liquids, and includes all types of objects or apparatuses that can enhance heat exchange performance through dropwise condensation, frosting delay or easy removal of a steam condensate.

In addition, the term "heat exchanger having super water-repellency" used herein refers to a heat exchanger which has super water-repellency on at least a heat transfer surface thereof.

FIG. 1 is a flow chart illustrating a method for manufacturing a super water-repellent polymer hierarchical structure according to one embodiment of the present invention.

Referring to FIG. 1, first, a parent substrate is formed (S100). Such a parent substrate is the parent for forming a super water-repellent polymer hierarchical structure by performing a molding method. Here, the parent substrate may be a metal substrate, a ceramic substrate or a polymer substrate in consideration of the durability required to repeatedly produce a super water-repellent polymer hierarchical structure. For example, such a parent substrate may be an aluminum substrate, a stainless steel substrate, a silicone substrate, a polydimethylsiloxane (PDMS) substrate or a polypropylene (PP) substrate.

Meanwhile, such a parent substrate may be a substrate which has a ratchet structure formed on the upper surface thereof, and a super water-repellent nano structure formed on the ratchet structure. That is, the parent substrate including the ratchet structure and the super water-repellent nano structure such as a super water-repellent nanowire or a nano sphere structure may allow droplets to move in one direction without an externally-applied force while the surface of the parent substrate is barely tilted.

Here, the forming of a parent substrate (S100) may include forming a ratchet structure on the upper surface of a substrate and forming a super water-repellent nano structure on the ratchet structure.

The forming of a ratchet structure on the upper surface of a substrate may be formed through, for example, computerized numerical control (CNC) processing.

Here, the ratchet structure is characterized by an absolute value of $W_2-W_1$ is 50 degrees or more, and a height of a constituent triangle of the ratchet structure ranges from 100 to 400 μm where $W_1$ may be one of the two lower angles of the constituent triangle of the ratchet structure, and $W_2$ may be the other of the two lower angles of the constituent triangle of the ratchet structure.

Subsequently, the forming of a super water-repellent nano structure on the ratchet structure may be formed by two methods.

First, in the forming of a super water-repellent nanowire structure on the ratchet structure, a nanowire structure may be formed on the ratchet structure using a hydrothermal synthesis method, a chemical vapor deposition method or an electrochemical deposition method, and a super water-repellent nanowire structure may be formed by performing water-repellent coating on the prepared nanowire structure using a fluorine-based material or silane-based material. Here, the water repellent coating process may be omitted.

Second, a super water-repellent nanowire structure may be formed by forming a nanowire structure on the ratchet structure by the same method as described above and performing vacuum drying.

For example, an aluminum substrate having a ratchet structure on the upper surface thereof may be immersed in a cobalt oxide-precursor mixed solution in which cobalt nitrate hexahydrate $(Co(NO_3)_2 \cdot 6H_2O)$ is mixed with urea $(CO(NH_2)_2)$ to grow a cobalt oxide nanowire on the ratchet structure at 95° C. for 12 hours through hydrothermal synthesis, and then dried at 190° C. in a vacuum atmosphere for 1 hour to grow a cobalt oxide super water-repellent nanowire.

Accordingly, as the super water-repellent nanowire structure is formed on the ratchet structure satisfying the above-described specific conditions, even while the substrate surface is barely tilted, for example, the substrate surface is tilted at 10 degrees or less, a parent substrate that allows droplets to move on the substrate in one direction without an external force even though the surface of the substrate is barely tilted, for example, the surface of the substrate is tilted at 10 degrees or less, may be formed.

Meanwhile, the super water-repellent nano structure may be a nanowire structure, a nano sphere structure or a nano hole structure.

Hereinafter, the principle of forces exerted on a droplet due to the ratchet structure will be described with reference to FIGS. 2 and 3.

FIG. 2 shows a constituent triangle of a ratchet structure.

Referring to FIG. 2, $W_1$ is one of the two bottom angles of the constituent triangle of a ratchet structure, and $W_2$ is the other of the two bottom angles of the constituent triangle of a ratchet structure.

In addition, the height of the constituent triangle of a ratchet structure is d, and the length of the triangle is 1.

FIG. 3 illustrates the principle of forces exerted on a droplet in the ratchet structure.

Referring to FIG. 3, when the shape of the surface structure is the same as shown in FIG. 3, the force exerted on a droplet due to the surface structure is represented by Expression 1 below.

$$F = \int_{Left}^{Right} \gamma_{lv}(\cos(\theta_A + w_1) - \cos(\theta_R + w_2))dl \quad \text{[Expression 1]}$$

$\theta_A, \theta_B$: 물방울과 표면과의 접촉각

$\gamma_{lv}$: 물방울의 표면장력

$\theta_A, \theta_B$: Contact angle between droplet and surface $\gamma_{lv}$: Surface tension of droplet From Expression 1, it can be seen that the force (F) exerted on a droplet due to the surface structure increases as the difference between $W_1$ and $W_2$ becomes larger.

Accordingly, since a super water-repellent nano structure is formed on the ratchet structure characterized by the conditions in which an absolute value of $W_2-W_1$ is 50 degrees or more, and a height of the constituent triangle of a ratchet structure ranges from 100 to 400 μm, even though the substrate surface is barely tilted, for example, the substrate surface is tilted at 10 degrees or less, droplets may move on the substrate in one direction without the application of an external force.

Referring again to FIG. 1, subsequently, a liquid polymer is applied on the formed parent substrate (S200).

The liquid polymer is not particularly limited in type as long as it can be used in a molding method. For example, the liquid polymer may be polydimethylsiloxane (PDMS), polymethylmethacrylate (PMMA), polypropylene (PP), polyurethane (PU), polyethylene (PE), polyvinylidene fluoride (PVDF) or polyethersulfone (PES).

Subsequently, the polymer applied on the parent substrate is cured (S300).

For example, polydimethylsiloxane (PDMS) may be cured by applying heat at 150° C. for approximately 10 minutes, and polypropylene (PP) may be liquefied at 180° C. for approximately 30 minutes, applied on the parent substrate, and cured by cooling.

Afterward, the cured polymer is separated from the parent substrate (S400). Thus, when the parent substrate having a ratchet structure is used, a polymer structure having a ratchet structure may be formed using such a molding method.

For example, when a parent substrate which has a ratchet structure formed on the upper surface thereof and a super water-repellent nanowire structure formed on the ratchet structure is used, a polymer hierarchical structure which has a ratchet structure formed on the upper surface thereof and a nano hole structure formed on the ratchet structure may be formed by such a molding method.

In another example, when a parent substrate having a ratchet structure formed on the upper surface thereof and a super water-repellent nano sphere structure formed on the ratchet structure is used, a polymer hierarchical structure having a ratchet structure formed on the upper surface thereof, and a nano sphere hole structure formed on the ratchet structure may be formed by the molding method.

Therefore, the polymer hierarchical structure manufactured by the molding method may have a ratchet structure which is the same as that of the parent substrate on the upper surface, and a nano structure having an opposite shape to the nano structure of the parent substrate may be formed on such a ratchet structure. Accordingly, the ratchet structure of the polymer hierarchical structure may also be characterized by the conditions in which the absolute value of $W_2-W_1$ is 50 degrees or more and the height of a constituent triangle of the ratchet structure is 100 to 400 μm. Thus, as a super water-repellent nano structure is disposed on such a ratchet structure, the polymer hierarchical structure is also a super water-repellent structure having a sliding angle of less than 10 degrees.

As a result, such a polymer hierarchical structure may also allow droplets to move on the substrate in one direction without an external force even when the hierarchical structure is barely tilted, for example, the hierarchical structure surface is tilted at 10 degrees or less.

The super water-repellent polymer hierarchical structure manufactured by the above method may be utilized again as a parent substrate, and a liquid polymer may be applied on such a parent substrate (S200), the applied liquid polymer is cured (S300), and the cured polymer is separated from the parent substrate (S400). In this case, the manufactured polymer hierarchical structure has super water-repellency.

For example, still another method for manufacturing a polymer hierarchical structure according to the present invention may include forming a first parent substrate having a ratchet structure formed on the upper surface thereof, applying a liquid polymer on the first parent substrate, curing the applied liquid polymer, forming a second parent substrate by separating the cured polymer from the first parent substrate, applying a liquid heterogeneous polymer on the second parent substrate, curing the applied liquid heterogeneous polymer, separating the cured heterogeneous polymer from the second parent substrate, and forming a super water-repellent nano structure on the ratchet structure on the surface of the separated heterogeneous polymer, wherein the heterogeneous polymer having a super water-repellent nano structure formed thereon is characterized by having a sliding angle of less than 10 degrees.

For example, yet another method for manufacturing a super water-repellent polymer hierarchical structure according to the present invention may include forming a first parent substrate having a ratchet structure formed on the upper surface thereof and a super water-repellent nano structure formed on the ratchet structure, applying a liquid polymer on the first parent substrate, curing the applied liquid polymer, forming a second parent substrate by separating the cured polymer from the first parent substrate, applying a liquid heterogeneous polymer on the second parent substrate, curing the applied liquid heterogeneous polymer, and separating the cured heterogeneous polymer from the second parent substrate, wherein the separated heterogeneous polymer is characterized by having a sliding angle of less than 10 degrees.

The ratchet structure used herein may be characterized by the conditions in which an absolute value of $W_2-W_1$ is 50 degrees or more, and a height of a constituent triangle of a ratchet structure is 100 to 400 μm, wherein $W_1$ may be one of the two lower angles of the constituent triangle of the ratchet structure, and $W_2$ may be the other of the two lower angles of the constituent triangle of the ratchet structure.

Preparation Example 1: Formation of Aluminum Parent Substrate Having Ratchet Structure An aluminum parent substrate having a ratchet structure formed on the upper surface thereof was formed through CNC processing.

FIG. 4 shows images illustrating an aluminum substrate having a ratchet structure formed on the upper surface thereof.

Referring to FIG. 4, one angle ($W_1$) of the two lower angles of a constituent triangle of the ratchet structure is approximately 26.56 degrees, and the other angle ($W_2$) of the two lower angles of the constituent triangle of the ratchet structure is approximately 90 degrees. Accordingly, the absolute value of $W_2-W_1$ is approximately 64 degrees.

In addition, the height (d) of the constituent triangle of the ratchet structure is 0.2 mm, and the length (l) of the lower side is 0.4 mm.

Comparative Example 1

A polymer ratchet structure was formed on the aluminum parent substrate having the ratchet structure formed in Preparation Example 1 using a molding method.

That is, as a parent substrate, a clean surface in which there is no nano structure on the surface of a ratchet structure was used, a polymer ratchet structure was formed by applying polydimethylsiloxane (PDMS) as a polymer material to the surface, curing the applied polymer material and separating the cured product.

FIG. 5 is a set of photographs of the polymer ratchet structure manufactured according to Comparative Example 1 and an image illustrating the result of measuring a contact angle and a sliding angle.

FIG. 5(A) is a photograph of a polymer ratchet structure actually formed according to Comparative Example 1, and FIG. 5(B) is an enlarged photograph of the surface of the ratchet structure of FIG. 5(A). Referring to FIGS. 5(A) and 5(B), it can be seen that a polymer ratchet structure may be formed using an aluminum ratchet structure as a parent substrate by a molding method.

FIG. 5(C) is an image illustrating the result of measuring a contact angle and a sliding angle of a polymer ratchet structure of Comparative Example 1. Referring to FIG. 5(C), it can be seen that the contact angle (θ) is 115 degrees, and the sliding angle is larger than 90 degrees (sliding angle>90 degrees).

Preparation Example 2: Formation of Super Water-Repellent Polymer Hierarchical Structure Having Nano Sphere Hole Structure A super water-repellent polymer hierarchical structure was manufactured according to one embodiment of the present invention.

FIG. 6 is a set of schematic cross-sectional views illustrating a method for manufacturing a super water-repellent polymer hierarchical structure according to Preparation Example 2 of the present invention.

Referring to FIG. 6(A), first, an aluminum parent substrate 100 having the ratchet structure 110 as described in Preparation Example 1 was formed.

Referring to FIG. 6(B), next, a polystyrene nano sphere structure was applied on the ratchet structure 110 of the aluminum parent substrate 100.

More specifically, a polystyrene nano sphere synthesized by stirring styrene and a radical initiator (azobisisobutyronitrile), adding the resulting mixture to a mixed solution of ethanol and polyvinylpyrrolidone, and heating the resulting product in a 70° C. water bath for 12 hours was applied on the aluminum substrate having a ratchet structure formed on the upper surface thereof through drop casting or dip coating.

Referring to FIG. 6(C), subsequently, polydimethylsiloxane (PDMS) as a liquid polymer 20 was applied on such a parent substrate 100, and cured using a hot plate at 150° C. for 10 minutes. Referring to FIG. 6(D), the cured polymer 21 was separated from the parent substrate 100. Referring to FIG. 6(E), a super water-repellent polymer hierarchical structure 200 was manufactured by the above-described molding method. Such a super water-repellent polymer hierarchical structure 200 is a hierarchical structure in which a ratchet structure 210 is formed on the upper surface thereof, and a nano sphere hole structure is formed as a nano structure 220 on the ratchet structure 210. In addition, both of the ratchet structure 210 and the nano structure 220 are composed of a polymer.

FIG. 7 is a set of photographs of the super water-repellent polymer hierarchical structure according to Preparation Example 2 of the present invention and an image illustrating the result of measuring a contact angle and a sliding angle.

FIG. 7(A) is a photograph of the super water-repellent polymer hierarchical structure according to Preparation Example 2, and FIG. 7(B) is an enlarged photograph of the surface of the super water-repellent polymer hierarchical structure of FIG. 7(A). Referring to FIGS. 7(A) and 7(B), it can be seen that a unidirectional super water-repellent polymer hierarchical structure may be formed using the aluminum ratchet structure having the super water-repellent nano sphere structure, which is disposed on the upper surface thereof, as a parent substrate by molding a hierarchical structure having both of a micro-scale ratchet structure and a nano-scale nano sphere structure. Here, a ratchet structure is formed on the upper surface of the super water-repellent polymer hierarchical structure, and nano holes corresponding to the super water-repellent nano sphere structure of the parent substrate are formed on the surface of the ratchet structure.

FIG. 7(C) is an image illustrating the result of measuring a contact angle and a sliding angle of the super water-repellent polymer hierarchical structure of Preparation Example 2. Referring to FIG. 7(C), it can be seen that the contact angle (θ) is 156 degrees, and the sliding angle is approximately less than 10 degrees.

Preparation Example 3: Manufacture of Super Water-Repellent Polymer Hierarchical Structure Through Molding of Etched Ratchet Structure A super water-repellent polymer hierarchical structure was manufactured according to one embodiment of the present invention.

FIG. 8 is a set of schematic cross-sectional views illustrating a method for manufacturing a super water-repellent polymer hierarchical structure according to Preparation Example 3 of the present invention.

Referring to FIG. 8(A), first, an aluminum parent substrate 100 having the ratchet structure 110 of Preparation Example 1 was formed.

Referring to FIG. 8(B), next, a super water-repellent nano structure 120 was formed on a surface of the ratchet structure 110 by immersing the parent substrate 100 in a 10% hydrochloric acid (HCl) aqueous solution and etching the substrate for approximately 10 minutes.

Referring to FIG. 8(C), subsequently, a liquid polymer 20 (here, polypropylene (PP)) liquefied at a high temperature (approximately 180° C.) was applied on the aluminum hierarchical aluminum parent substrate 100 having the ratchet structure 110 and the super water-repellent nano structure 120, and cooled at room temperature for solidification.

Referring to FIG. 8(D), the cured polymer 21 (here, polypropylene (PP)) was separated from the parent substrate 100.

Therefore, referring to FIG. 8(E), a super water-repellent polymer hierarchical structure 200 is a hierarchical structure in which a ratchet structure 210 is formed on the upper surface thereof and a nano structure 220 formed on the ratchet structure 210.

FIG. 9 is a set of photographs of the super water-repellent polymer hierarchical structure according to Preparation Example 3 of the present invention and an image illustrating the result of measuring a contact angle and a sliding angle.

FIG. 9(A) is a photograph of the super water-repellent polymer hierarchical structure according to Preparation Example 3, and FIG. 9(B) is an enlarged photograph of a surface of the super water-repellent polymer hierarchical structure of FIG. 9(A). Referring to FIGS. 9(A) and 9(B), it can be seen that a super water-repellent polymer hierarchical structure is formed using an etched aluminum ratchet structure as a parent substrate by a molding method, and a nano structure opposite to the surface of the etched aluminum ratchet structure is formed on the ratchet structure on the surface of the super water-repellent polymer hierarchical structure.

FIG. 9(C) is an image illustrating the result of measuring a contact angle and a sliding angle of the super water-repellent polymer hierarchical structure of Preparation Example 3. Referring to FIG. 9(C), it can be seen that the contact angle (θ) is 151 degrees, and the sliding angle is approximately less than 10 degrees.

Preparation Example 4: Manufacture of Super Water-Repellent Polymer Hierarchical Structure by Depositing Cobalt Oxide Nanowire on Polymer Ratchet Structure A super water-repellent polymer hierarchical structure was manufactured according to one embodiment of the present invention.

FIG. 10 is a set of schematic cross-sectional views illustrating a method for manufacturing a super water-repellent polymer hierarchical structure according to Preparation Example 4 of the present invention.

Referring to FIG. 10(A), first, an aluminum parent substrate 100 having a ratchet structure 110 which is the same as described in Preparation Example 1 was formed.

Referring to FIG. 10(B), next, polydimethylsiloxane (PDMS) as a liquid polymer 20 was applied on the parent substrate 100, and then cured. Referring to FIG. 10(C), the cured polymer 21 was separated from the parent substrate 100. Referring to FIG. 10(D), a polymer structure 22 was formed by the molding method described above.

Referring to FIG. 10(E), subsequently, a super water-repellent polymer hierarchical structure 200 was formed by depositing a cobalt oxide nanowire structure 220 on a ratchet structure 210 of the polymer structure 22.

More specifically, a cobalt oxide nanowire structure was formed on the ratchet structure by immersing the ratchet-shaped polymer structure in a cobalt oxide-precursor mixed solution prepared by mixing cobalt nitrate hexahydrate $(Co(NO_3)_2.6H_2O)$ with urea $(CO(NH_2)_2)$ at 95° C. for 12 hours by a hydrothermal synthesis method, and dried at 190° C. in a vacuum atmosphere for 1 hour to grow a cobalt oxide super water-repellent nanowire structure on the ratchet structure.

Thus, the super water-repellent polymer hierarchical structure 200 is a hierarchical structure in which a ratchet structure 210 is formed on the upper surface thereof, and the nano structure 220 formed on the ratchet structure 210.

FIG. 11 is a set of photographs of the super water-repellent polymer hierarchical structure according to Preparation Example 4 of the present invention and an image illustrating the result of measuring a contact angle and a sliding angle.

FIG. 11(A) is a photograph of the super water-repellent polymer hierarchical structure according to Preparation Example 4, and FIG. 11(B) is an enlarged photograph of the surface of the super water-repellent polymer hierarchical structure of FIG. 11(A). Referring to FIG. 11(A) and FIG. 11(B), it can be seen that a polymer structure was formed using an aluminum ratchet structure as a parent substrate by a molding method, and a cobalt oxide nanowire was deposited on the ratchet structure formed on the surface of the polymer structure. Accordingly, the ratchet structure is formed on the upper surface of the super water-repellent polymer hierarchical structure, and a cobalt oxide nanowire structure is disposed on a surface of the ratchet structure.

FIG. 11(C) is an image illustrating the result of measuring a contact angle and a sliding angle of the super water-repellent polymer hierarchical structure of Preparation Example 4. Referring to FIG. 11(C), it can be seen that the contact angle (θ) is 154 degrees, and the sliding angle is approximately less than 5 degrees.

Preparation Example 5: Manufacture of Super Water-Repellent Polymer Hierarchical Structure by Growing Zinc Oxide Nanowire Structure on Polymer Ratchet Structure and Molding A super water-repellent polymer hierarchical structure was manufactured according to one embodiment of the present invention.

FIG. 12 is a set of schematic cross-sectional views illustrating a method for manufacturing a super water-repellent polymer hierarchical structure according to Preparation Example 5 of the present invention.

Referring to FIG. 12(A), the polymer ratchet structure formed in Comparative Example 1 was used as a parent substrate 22.

Referring to FIG. 12(B), subsequently, a zinc oxide (ZnO) nanowire structure 220 was grown on a ratchet structure 210 of the parent substrate 22, which is a polymer ratchet structure.

More specifically, to form a seed layer for growing the zinc oxide (ZnO) nanowire on the substrate which has a ratchet structure formed on the upper surface thereof, the zinc oxide nanowire was able to be grown by immersing a mixed solution of zinc acetate dihydrate $(Zn(CH_3COO)_2.2H_2O)$ and ethanol $(C_2H_5OH)$, drying the solution at approximately 200° C. for approximately 20 minutes, and performing hydrothermal synthesis in an aqueous solution, in which zinc nitrate hexahydrate $(Zn(NO_3)_2.6H_2O)$ and hexamethylenetetramine $(C_6H_{12}N_4)$ were dissolved, at 95° C. for 3 hours.

Referring to FIG. 12(C), subsequently, polypropylene (PP) as a liquid heterogeneous polymer 30 was applied on the parent substrate 22, and then cured. Here, the polypropylene (PP) was liquefied at 180° C., applied on the parent substrate 22, cooled at room temperature to solidify for curing.

Referring to FIG. 12(D), the cured polymer 31 was separated from the parent substrate 22. Referring to FIG. 12(E), a super water-repellent polymer hierarchical structure 300 was manufactured by the above-described molding method. The super water-repellent polymer hierarchical structure 300 is a hierarchical structure in which a ratchet structure 310 is formed on the upper surface thereof, and a nano hole structure is formed as a nano structure 320 on the ratchet structure 310. In addition, both of the ratchet structure 310 and the nano structure 320 are composed of a polymer.

FIG. 13 is a set of photographs of the super water-repellent polymer hierarchical structure according to Preparation Example 5 of the present invention and an image illustrating the result of measuring a contact angle and a sliding angle.

FIG. 13(A) is a photograph of the super water-repellent polymer hierarchical structure according to Preparation Example 5, and FIG. 13(B) is an enlarged photograph of the super water-repellent polymer hierarchical structure surface of FIG. 13(A). Referring to FIGS. 13(A) and 13(B), it can be seen that a unidirectional super water-repellent polymer hierarchical structure is able to be formed using a polymer ratchet structure having a super water-repellent nanowire structure thereon as a parent substrate by molding a hierarchical structure having both of a micro-scale ratchet structure and a nano-scale nanowire structure. The upper surface of the super water-repellent polymer hierarchical structure has a ratchet structure formed on the upper surface thereof, and nano holes corresponding to the super water-repellent nanowire structure of the parent substrate are formed in the surface of the ratchet structure.

FIG. 13(C) is an image illustrating the result of measuring a contact angle and a sliding angle of the super water-repellent polymer hierarchical structure of Preparation Example 5. Referring to FIG. 13(C), it can be seen that the contact angle (θ) is 155 degrees, and the sliding angle is approximately less than 10 degrees.

Preparation Example 6: Manufacture of Super Water-Repellent Polymer Hierarchical Structure by Molding Super Water-Repellent Polymer Hierarchical Structure Having Nano Sphere Hole Structure A super water-repellent polymer hierarchical structure was manufactured according to one embodiment of the present invention.

FIG. 14 is a set of schematic cross-sectional views illustrating a method for manufacturing a super water-repellent polymer hierarchical structure according to Preparation Example 6 of the present invention.

Referring to FIG. 14(A), first, the super water-repellent polymer hierarchical structure having nano sphere holes, manufactured in Preparation Example 2, was used as a parent substrate 200.

Referring to FIG. 14(B), subsequently, a liquid heterogeneous polymer material 30 was applied on the parent substrate 200, which is the super water-repellent polymer hierarchical structure having nano sphere holes.

More specifically, the parent substrate 200, which is the super water-repellent polymer hierarchical structure having nano sphere holes, was liquefied at a high temperature (approximately 180° C.) using heat-resistant polydimethylsiloxane (PDMS) and polypropylene (PP) as a heterogeneous polymer material, applied on the parent substrate 200, which is the super water-repellent polymer hierarchical structure, and cooled at room temperature to solidify for curing.

Referring to FIG. 14(C), the cured heterogeneous polymer 31 was separated from the parent substrate 200.

Referring to FIG. 14(D), a super water-repellent polymer hierarchical structure 300 was manufactured in a different form using the above-described molding method. The super water-repellent polymer hierarchical structure 300 is a hierarchical structure in which a ratchet structure 310 is formed on the upper surface thereof, and a nano structure 320 formed on the ratchet structure 310. In addition, both of the ratchet structure 310 and the nano structure 320 are composed of a polymer.

FIG. 15 is a set of photographs of a super water-repellent polymer hierarchical structure according to Preparation Example 6 of the present invention and an image illustrating the result of measuring a contact angle and a sliding angle.

FIG. 15(A) is a photograph of a super water-repellent polymer hierarchical structure according to Preparation Example 6, and FIG. 15(B) is an enlarged photograph of the surface of the super water-repellent polymer hierarchical structure of FIG. 15(A). Referring to FIGS. 15(A) and 15(B), it can be seen that a polymer ratchet structure having a super water-repellent nano sphere hole structure thereon may be used as a parent substrate to create a hierarchical structure having both of a micro-scale ratchet structure and a nano-scale nano sphere structure, thereby forming a unidirectional super water-repellent polymer hierarchical structure. Here, the ratchet structure is formed on the upper surface of the super water-repellent polymer hierarchical structure, and nano spheres corresponding to the super water-repellent nano sphere hole structure of the parent substrate are formed on the surface of the ratchet structure.

FIG. 15(C) is an image illustrating the result of measuring a contact angle and a sliding angle of the super water-repellent polymer hierarchical structure of Preparation Example 6. Referring to FIG. 15(C), it can be seen that the contact angle (θ) is 158 degrees, and the sliding angle is approximately less than 10 degrees.

FIG. 16 is a flow chart illustrating a method for illustrating a super water-repellent polymer hierarchical structure according to another embodiment of the present invention.

Referring to FIG. 16, the method for manufacturing a super water-repellent polymer hierarchical structure according to one embodiment of the present invention may include forming a parent substrate having a ratchet structure formed on the upper surface thereof and a super water-repellent nano structure formed on the ratchet structure (S110), forming a protective layer for preventing the detachment of the super water-repellent nano structure on the super water-repellent nano structure (S210), applying a liquid polymer on the parent substrate (S310), curing the applied liquid polymer (S410), and separating the cured polymer from the parent substrate and washing the separated polymer (S510). The polymer separated from the parent substrate is characterized by having a sliding angle of less than 10 degrees.

Hereinafter, the method will be described in detail as follows:

First, a parent substrate is formed (S110). The parent substrate is a parent for manufacturing a super water-repellent polymer hierarchical structure by performing a molding method. The parent substrate may be a metal substrate, a ceramic substrate or a polymer substrate in consideration of durability for repeatedly producing a super water-repellent polymer hierarchical structure. For example, the parent substrate may be an aluminum substrate, a stainless steel substrate, a silicone substrate, a polydimethylsiloxane (PDMS) substrate, a polytetrafluorethylene (PTFE) substrate or a polypropylene (PP) substrate.

The parent substrate may be a substrate having a ratchet structure formed on the upper surface thereof and a super water-repellent nano structure formed on the ratchet structure. That is, the parent substrate including the ratchet structure and the super water-repellent nano structure may allow droplets to move in one direction without an externally-applied force while the surface is barely tilted. Such unidirectional behavior was described in detail with reference to FIGS. 2 and 3.

In addition, the super water-repellent nano structure may include a nanowire structure, a nano sphere structure, or a nano hole structure.

For example, the forming of the parent substrate may include forming a ratchet structure on the upper surface of a substrate and forming a super water-repellent nano structure on the ratchet structure.

The forming of a ratchet structure on the upper surface of the substrate may be formed by, for example, CNC processing.

The ratchet structure is characterized by an absolute value of $W_2-W_1$ is 50 degrees or more, and a height of a constituent triangle of a ratchet structure is 100 to 400 μm where $W_1$ may be one of the two lower angles of the constituent triangle of the ratchet structure, and $W_2$ may be the other of the two lower angles of the constituent triangle of the ratchet structure.

As still another example, in the forming of a ratchet structure on the upper surface thereof, the substrate having a ratchet structure may be formed on the parent of the ratchet structure using a molding method.

Subsequently, the forming of a super water-repellent nano structure on the ratchet structure may be performed by four methods.

First, in the forming of a super water-repellent nanowire structure on the ratchet structure, a super water-repellent nanowire structure may be formed by forming a nanowire structure on the ratchet structure using a hydrothermal synthesis method, a chemical vapor deposition method or an electrochemical deposition method, and water-repellent coating the formed nanowire structure with a fluoro-based material or a silane-based material. Here, the water-repellent coating process may be omitted in some cases.

Second, a super water-repellent nanowire structure may be formed by forming a nanowire structure on the ratchet structure using a hydrothermal synthesis method, a chemical vapor deposition method or an electrochemical deposition method, and performing vacuum drying.

For example, a cobalt oxide super water-repellent nanowire may be grown by immersing an aluminum substrate having a ratchet structure formed on the upper surface thereof in a cobalt oxide-precursor mixed solution in which cobalt nitrate hexahydrate ($Co(NO_3)_2 \cdot 6H_2O$) is mixed with urea ($CO(NH_2)_2$) to grow a cobalt oxide nanowire on the ratchet structure through hydrothermal synthesis at 95° C. for 12 hours, and drying the substrate at 190° C. in a vacuum atmosphere for 1 hour.

Third, a nano sphere structure may be applied on the ratchet structure by a nano structure application method.

For example, a nano sphere made by polymerizing PVP in a mixed solution of styrene and AIBN may be applied to the aluminum substrate having a ratchet structure formed on the upper surface thereof.

Fourth, a nano hole structure may be formed by etching the ratchet structure with a chemical solution.

For example, a super water-repellent nano hole structure may be formed on a surface of a ratchet structure by immersing the aluminum substrate having a ratchet structure formed on the upper surface thereof in a 10% HCl aqueous solution to etch the substrate for approximately 10 minutes. On the other hand, in some cases, it can be considered that, as the etched product, a super water-repellent nano protrusion structure is manufactured on a surface of the ratchet structure.

Thus, as the super water-repellent nano structure is formed on the ratchet structure satisfying the above-described specific conditions, a parent substrate that allows droplets to move in one direction without an external force may be formed on the substrate even when the surface of the substrate is barely tilted, for example, the surface of the substrate is tilted at 10 degrees or less.

Subsequently, a protective layer for preventing the detachment of the super water-repellent nano structure is formed on the super water-repellent nano structure (S210).

As described above, damage to and detachment of the nano structure during repeated molding using a parent substrate may be prevented by forming a protective layer on the super water-repellent nano structure.

The protective layer is a layer applied on the super water-repellent nano structure in the form of a thin film, and the thickness of such a protective layer may be set to be as thin as a nanometer size. For example, the thickness of the protective layer may be 20 to 300 nm. Accordingly, the setting of the thickness of the protective layer to 20 to 300 nm does not have a significant influence on the super water-repellency of the nano structure manufactured after molding.

In addition, there is no limit to a material for the protective layer. For example, the protective layer may include a metallic material or a polymer material.

For example, the metallic material for the protective layer may be aluminum (Al), gold (Au) or platinum (Pt). In addition, the polymer material for the protective layer may be polydimethylsiloxane (PDMS), polymethylmethacrylate (PMMA), polyethylene (PE), polyvinylidene fluoride (PVDF) or polyethersulfone (PES).

In addition, the protective layer may be a single layer or multiple layers. For example, the protective layer may be a single metal or polymer layer, or multiple layers including a metal layer and a polymer layer disposed on the metal layer.

The protective layer may be formed by sol-gel coating, plasma enhanced chemical vapor deposition (PECVD), sputtering, electron beam deposition or atomic layer deposition (ALD).

Subsequently, a liquid polymer is applied on the formed parent substrate (S310).

There is no particular limit to the type of liquid polymer as long as it can be used in a molding method. Examples of such liquid polymers may include polydimethylsiloxane (PDMS), polymethylmethacrylate (PMMA), polypropylene (PP), polyurethane (PU), polyethylene (PE), polyvinylidene fluoride (PVDF), polytetrafluorethylene(PTFE) and polyethersulfone (PES).

Subsequently, the polymer applied on the parent substrate is cured (S410).

For example, polydimethylsiloxane (PDMS) may be cured by heating at 150° C. for approximately 10 minutes, and polypropylene (PP) may be cured by liquefaction at 180° C. for approximately 30 minutes, application on the parent substrate, and cooling.

Subsequently, the cured polymer is separated from the parent substrate and washed (S510). Accordingly, when the parent substrate having the ratchet structure is used, a polymer structure having a ratchet structure may be formed using the above-described molding method.

For example, when the parent substrate having a ratchet structure formed on the upper surface thereof, a super water-repellent nano sphere structure formed on the ratchet structure and a protective layer formed on the super water-repellent nanowire structure is used, a polymer hierarchical structure having a ratchet structure formed on the upper surface thereof and a nano hole structure formed on the ratchet structure may be formed.

As another example, when a parent substrate having a ratchet structure formed on the upper surface thereof, a super water-repellent nano sphere structure formed on the ratchet structure and a protective layer formed on the super water-repellent nano sphere structure is used, a polymer hierarchical structure having a ratchet structure formed on the upper surface thereof and a concave hemispherical nano structure formed on the ratchet structure may be formed by the above-described molding method.

In yet another example, when a parent substrate having a ratchet structure formed on the upper surface thereof, a super water-repellent nano hole or nano protrusion structure formed on the ratchet structure and a protective layer formed on the super water-repellent nanowire structure is used, a super water-repellent polymer hierarchical structure having a ratchet structure formed on the upper surface thereof and a nanowire or nano protrusion structure formed on the ratchet structure may be formed using the molding method described above.

Thus, in the super water-repellent polymer hierarchical structure manufactured by the molding method, a ratchet structure that is the same as that of the parent substrate may be formed on the upper surface thereof, and a nano structure that is similar to the opposite shape of the nano structure of the parent substrate may be formed on the ratchet structure.

Accordingly, the ratchet structure of the super water-repellent polymer hierarchical structure may also be characterized by an absolute value of $W_2-W_1$ is 50 degrees or more, and a height of the constituent triangle of a ratchet structure is 100 to 400 µm. Therefore, since the super water-repellent nano structure is disposed on the ratchet structure, the super water-repellent polymer hierarchical structure also becomes a super water-repellent structure having a sliding angle of less than 10 degrees.

Therefore, the super water-repellent polymer hierarchical structure may also allow droplets to move on the substrate in one direction without an external force while the hierarchical structure is barely tilted, for example, the surface of the super water-repellent polymer hierarchical structure is tilted only at 10 degrees or less.

In addition, the super water-repellent polymer hierarchical structure may be repeatedly formed by repeatedly using the parent substrate formed as described above. Meanwhile, in the middle of the repeated manufacture of the super water-repellent polymer hierarchical structure, washing the upper surface of the parent substrate may be further included.

FIG. 17 is a flow chart illustrating a method for manufacturing a super water-repellent polymer hierarchical structure according to still another embodiment of the present invention.

Referring to FIG. 17, the method may include forming a first parent substrate having a ratchet structure formed on the upper surface thereof and a super water-repellent nano structure formed on the ratchet structure (S120), forming a protective layer for preventing the detachment of the super water-repellent nano structure on the super water-repellent nano structure (S220), applying a liquid polymer on the first parent substrate (S320), curing the applied liquid polymer (S420), separating the cured polymer from the first parent substrate and washing the separated polymer to form a second parent substrate (S520), applying a liquid heterogeneous polymer on the second parent substrate (S620), curing the applied liquid heterogeneous polymer (S720) and separating the cured heterogeneous polymer from the second parent substrate and washing the separated polymer (S820). The separated heterogeneous polymer is characterized by having a sliding angle of less than 10 degrees.

First, a first parent substrate having a ratchet structure formed on the upper surface thereof and a super water-repellent nano structure formed on the ratchet structure is formed (S120).

The ratchet structure is characterized by the conditions in which an absolute value of $W_2-W_1$ is 50 degrees or more, and a height of a constituent triangle of the ratchet structure is 100 to 400 μm, wherein $W_1$ may be one of the two lower angles of the constituent triangle of the ratchet structure, and $W_2$ may be the other of the two lower angles of the constituent triangle of the ratchet structure.

In addition, the super water-repellent nano structure may be a nanowire structure, a nano sphere structure or a nano hole structure.

The first parent substrate is the same as the parent substrate described with reference to FIG. 1, and thus a detailed description of the first parent substrate will be omitted.

Subsequently, the protective layer for preventing the detachment of the super water-repellent nano structure is formed on the super water-repellent nano structure (S220).

As described above, as a protective layer is formed on the super water-repellent nano structure, damage to and detachment of the nano structure during repeated molding using the parent substrate may be prevented.

The protective layer is a layer applied on the super water-repellent nano structure in the form of a thin film, and the thickness of the protective layer may be set to be as thin as a nanometer size. For example, the thickness of the protective layer may be 20 to 300 nm. Accordingly, as the thickness of the protective layer is set to be 20 to 300 nm, the protective layer does not have a significant influence on the super water-repellency of the nano structure manufactured after molding.

In addition, there is no specific limit to a material for the protective layer. For example, the protective layer may be composed of a metallic material or a polymer material.

For example, the metallic material for the protective layer may be aluminum (Al), gold (Au) or platinum (Pt). In addition, the polymer material of the protective layer may be polydimethylsiloxane (PDMS), polymethylmethacrylate (PMMA), polyethylene (PE), polyvinylidene fluoride (PVDF), or polyethersulfone (PES).

In addition, the protective layer may be a single layer or multiple layers. For example, the protective layer may be a single metal or polymer layer, or multiple layers including a metal layer and a polymer layer disposed on the metal layer.

The protective layer may be formed by sol-gel coating, plasma enhanced chemical vapor deposition (PECVD), sputtering, electron beam deposition or atomic layer deposition (ALD).

Subsequently, a liquid polymer is applied on the manufactured parent substrate (S320).

There is no particular limit to the type of liquid polymer as long as it can be used in a molding method. For example, the liquid polymer may be polydimethylsiloxane (PDMS), polymethylmethacrylate (PMMA), polypropylene (PP), polyurethane (PU), polyethylene (PE), polyvinylidene fluoride (PVDF), polytetrafluorethylene (PTFE) or polyethersulfone (PES).

Subsequently, the polymer applied on the parent substrate is cured (S420).

For example, polydimethylsiloxane (PDMS) may be cured by heating at 150° C. for approximately 10 minutes, and polypropylene (PP) may be cured by liquefaction at 180° C. for approximately 30 minutes, application on the parent substrate, and cooling.

Subsequently, a second parent substrate is formed by separating the cured polymer from the parent substrate and washing the separated polymer (S520).

Subsequently, a liquid heterogeneous polymer is applied on the second parent substrate (S620). That is, a heterogeneous polymer that is different from the polymer material of the second parent substrate may be selected for molding.

Subsequently, the applied liquid heterogeneous polymer is cured (S720).

Subsequently, the cured heterogeneous polymer may be separated from the second parent substrate and washed (S820).

Thus, a heterogeneous super water-repellent polymer hierarchical structure may be manufactured by a molding method again using the super water-repellent polymer hierarchical structure manufactured by a molding method as a second parent substrate.

Preparation Example 7: Manufacture of Super Water-Repellent Polymer Hierarchical Structure Having Concave Hemispherical Nano Structure A super water-repellent polymer hierarchical structure was manufactured according to one embodiment of the present invention.

FIG. 18 is a set of schematic cross-sectional views illustrating a method for manufacturing a super water-repellent polymer hierarchical structure according to Preparation Example 7 of the present invention.

Referring to FIG. 18(A), first, an aluminum parent substrate 100 having a ratchet structure 110, which is the same as described in Preparation Example 1, was formed.

Referring to FIG. 18(B), subsequently, a polystyrene nano sphere structure was applied on the ratchet structure 110 of the aluminum parent substrate 100.

More specifically, nano spheres that are synthesized by stirring styrene and a radical initiator (azobisisobutyronitrile), adding the resulting mixture to a mixed solution of ethanol and polyvinylpyrrolidone and heating the resulting solution in a 70° C. water bath for 12 hours were applied on the aluminum substrate having the ratchet structure formed on the upper surface thereof by drop casting or dip coating.

Referring to FIG. 18(C), subsequently, the hierarchical structure composed of the ratchet structure 110 and the nano sphere structure 120 was coated with a metal thin film of platinum (Pt) by sputtering, and then a protective layer 130 was deposited by dip coating with poly styrene sulfonic acid sodium salt (PSSNa).

Referring to FIG. 18(D), subsequently, polydimethylsiloxane (PDMS) as a liquid polymer 20 was applied on the parent substrate 100, and then cured using a hot plate at 150° C. for 10 minutes.

Referring to FIG. 18(E), the cured polymer 21 was separated from the parent substrate 100 and washed.

Referring to FIG. 18(F), a super water-repellent polymer hierarchical structure 200 was manufactured using the above-described molding method. The super water-repellent polymer hierarchical structure 200 is a structure in which a ratchet structure 210 is formed in the upper surface thereof and a nano structure 220 is formed on the ratchet structure 210. The nano structure 220 may be a concave hemispherical nano structure. In addition, both of the ratchet structure 210 and the nano structure 220 are composed of the same polymer.

FIG. 19 is a set of photographs of the super water-repellent polymer hierarchical structure according to Preparation Example 7 of the present invention and an image illustrating the result of measuring a contact angle and a sliding angle.

FIG. 19(A) is a photograph of the super water-repellent polymer hierarchical structure according to Preparation Example 7, and FIG. 19(B) is an enlarged photograph of the surface of the super water-repellent polymer hierarchical structure of FIG. 19(A). Referring to FIGS. 19(A) and 19(B), it can be seen that a unidirectional super water-repellent polymer hierarchical structure may be formed by molding a hierarchical structure having both of a micro-scale ratchet structure and a nano-scale nano sphere structure using an aluminum ratchet structure having a super water-repellent nano sphere structure formed thereon as a parent substrate. On the upper surface of the super water-repellent polymer hierarchical structure, a ratchet structure is formed, and a concave hemispherical nano structure corresponding to the super water-repellent nano sphere structure of the parent substrate is formed on the surface of the ratchet structure.

FIG. 19(C) is an image illustrating the result of measuring a contact angle and a sliding angle of the super water-repellent polymer hierarchical structure of Preparation Example 7. Referring to FIG. 19(C), it can be seen that the contact angle (θ) is 156 degrees, and the sliding angle is approximately less than 10 degrees.

FIG. 19(D) shows a parent substrate in which a protective layer including a platinum thin film with a thickness of several tens of nanometers, formed using sputtering, and a polymer thin film formed by dip coating with a PSSNa aqueous solution according to Preparation Example 7, and it can be confirmed that a micro-scale ratchet structure and a nano-scale nano sphere structure are clearly visible.

FIG. 19(E) is an image of the surface of a parent substrate after a polymer super water-repellent hierarchical structure is repeatedly manufactured using the parent substrate which is coated with the protective layer of FIG. 19(D). Referring to FIG. 19(E), it can be confirmed that nano sphere structures protected by the protective layer are present intact on the parent substrate even after the repeated molding procedures.

FIG. 20 shows the result of measuring a contact angle after the super water-repellent polymer hierarchical structure according to Preparation Example 7 is repeatedly manufactured.

Referring to FIG. 20, the super water-repellent polymer hierarchical structure was repeatedly manufactured seven times using the same parent substrate and the contact angle of each structure was measured, and as a result, it can be seen that the contact angle is in the range of approximately 152 to 156 degrees. Since the nano sphere structures are not detached due to the protective layer after the repeated molding, it can be seen that the manufactured super water-repellent polymer hierarchical structures are able to maintain high super water-repellency.

Preparation Example 8: Manufacture of Super Water-Repellent Polymer Hierarchical Structure by Molding of Etched Ratchet Structure A super water-repellent polymer hierarchical structure was manufactured according to one embodiment of the present invention.

FIG. 21 is a set of schematic cross-sectional views illustrating a method for manufacturing a super water-repellent polymer hierarchical structure according to Preparation Example 8 of the present invention.

Referring to FIG. 21(A), first, an aluminum parent substrate 100 having a ratchet structure which is the same as described in Preparation Example 1 was formed.

Referring to FIG. 21(B), subsequently, a super water-repellent nano structure 120 was manufactured on a surface of the ratchet structure 110 by immersing the parent substrate 100 in a 10% HCl aqueous solution to etch for approximately 10 minutes. The super water-repellent nano structure 120 is a nano hole structure.

Referring to FIG. 21(C), subsequently, a liquid polymer 20 (here, polypropylene (PP)) liquefied at a high temperature (approximately 180° C.) was applied on the aluminum hierarchical structure parent substrate 100 having the ratchet structure 110 and the super water-repellent nano structure 120, and then solidified by cooling at room temperature.

Referring to FIG. 21(D), the cured polymer 21 (here, polypropylene (PP)) was separated from the parent substrate 100 and washed.

Therefore, referring to FIG. 21(E), the super water-repellent polymer hierarchical structure 200 is a hierarchical structure in which a ratchet structure 210 is formed on the upper surface thereof, and a super water-repellent nano structure 220 is formed on the ratchet structure 210.

FIG. 22 is a set of photographs of the super water-repellent polymer hierarchical structure according to Preparation Example 8 of the present invention and an image illustrating the result of measuring a contact angle and a sliding angle.

FIG. 22(A) is a photograph of the super water-repellent polymer hierarchical structure according to Preparation Example 8, and FIG. 22(B) is an enlarged photograph of the surface of the super water-repellent polymer hierarchical structure of FIG. 22(A). Referring to FIGS. 22(A) and 22(B), it can be seen that a super water-repellent polymer hierarchical structure is formed by a molding method using the etched aluminum ratchet structure as a parent substrate, and a nano structure opposite to the shape of the etched surface of the aluminum ratchet structure is formed on a surface of the super water-repellent polymer hierarchical structure.

FIG. 22(C) is an image illustrating the result of measuring a contact angle and a sliding angle of the super water-repellent polymer hierarchical structure of Preparation Example 8. Referring to FIG. 22(C), it can be seen that the contact angle (θ) is 151 degrees, and the sliding angle is approximately less than 10 degrees.

FIG. 22(D) is an image of the etched surface of the ratchet structure of the parent substrate after the polymer structure is separated. Referring to FIG. 22(D), it can be seen that the surface structure of the parent substrate is well maintained after molding separation with only the above-described manufacturing process.

FIG. 22(E) shows an image of a surface of the super water-repellent polymer hierarchical structure separated from the parent substrate. Referring to FIG. 22(E), it can be confirmed that a surface of the super water-repellent polymer hierarchical structure is separated from the parent substrate, and it can be seen that the nano structure of the parent substrate is detached or does not remain due to a polymer material.

Meanwhile, to facilitate separation from the parent substrate, coating with a lubricant such as PSSNa may be additionally performed before the application of a liquid polymer.

Preparation Example 9: Manufacture of Super Water-Repellent Polymer Hierarchical Structure by Growing Cerium Oxide Nanowire Structure on Aluminum Ratchet Structure and Molding A super water-repellent polymer hierarchical structure was manufactured according to one embodiment of the present invention.

FIG. 23 is a set of schematic cross-sectional views illustrating a method for manufacturing a super water-repellent polymer hierarchical structure according to Preparation Example 9 of the present invention.

Referring to FIG. 23(A), an aluminum parent substrate 100 for a ratchet structure 110 which is the same as described in Preparation Example 1 was manufactured.

Referring to FIG. 23(B), subsequently, a cerium oxide ($CeO_2$) nanowire structure 120 was grown on the ratchet structure 110 of the parent substrate 100.

More specifically, to prepare a cerium precursor mixed solution for $CeO_2$ nanowire growth on the substrate having the ratchet structure formed on the upper surface thereof, cerium (III) nitrate hexahydrate ($Ce(NO_3)_3 \cdot 6H_2O$) and urea ($CO(NH_2)_2$) were mixed with water. The parent substrate 100 was immersed in the resulting cerium precursor mixed solution to grow a $CeO_2$ nanowire structure on the substrate at 95° C. for 24 hours by a hydrothermal synthesis method, and then heated in air at 350° C. for 4 hours and dried in a vacuum atmosphere at 190° C. for 1 hour to grow a $CeO_2$ super water-repellent nanowire structure on the parent substrate 100.

Referring to FIG. 23(C), subsequently, polydimethylsiloxane (PDMS) as a liquid polymer 20 was applied on the parent substrate 100, and then cured.

Referring to FIG. 23(D), the resulting cured polymer 21 was separated from the parent substrate 100 and washed.

Therefore, referring to FIG. 23(E), a super water-repellent polymer hierarchical structure 200 is a hierarchical structure having a ratchet structure 210 formed at an upper part thereof and a super water-repellent nano structure 220 formed on the ratchet structure 210.

FIG. 24 is a set of photographs of the super water-repellent polymer hierarchical structure according to Preparation Example 9 of the present invention and an image illustrating the result of measuring a contact angle and a sliding angle.

FIG. 24(A) is a photograph of the super water-repellent polymer hierarchical structure according to Preparation Example 9, and FIG. 24(B) is an enlarged photograph of a surface of the super water-repellent polymer hierarchical structure of FIG. 24(A). Referring to FIGS. 24(A) and 24(B), it can be seen that a unidirectional super water-repellent polymer hierarchical structure may be formed by molding a hierarchical structure having both of a micro-scale ratchet structure and a nano-scale nanowire structure using an aluminum ratchet structure having a super water-repellent nanowire structure disposed thereon as a parent substrate. The upper surface of the super water-repellent polymer hierarchical structure is the surface on which the ratchet structure is formed, and nano holes corresponding to the super water-repellent nanowire structure of the parent substrate are formed in the surface of the ratchet structure.

FIG. 24(C) is an image illustrating the result of measuring a contact angle and a sliding angle a super water-repellent polymer hierarchical structure of Preparation Example 9. Referring to FIG. 24(C), it can be seen that the contact angle (θ) is 151 degrees, and the sliding angle is approximately less than 10 degrees.

FIG. 24(D) is an image of an etched surface of the ratchet structure of the parent substrate after the polymer structure is separated. Referring to FIG. 24(D), it can be seen that the $CeO_2$ nanowire structure is well maintained on the surface of the parent substrate after the molding and separation by only the manufacturing process.

FIG. 24(E) is an image of a surface of the super water-repellent polymer hierarchical structure separated from the parent substrate. Referring to FIG. 24(E), it can be confirmed that the surface of the super water-repellent polymer hierarchical structure is separated from the parent substrate, and it can be seen that the nano structure of the parent substrate is detached or does not remain due to a polymer material.

Meanwhile, to further facilitate separation and reinforce the maintenance of the parent substrate, coating with Pt metal for preventing the detachment of the structure or coating with a lubricant such as PSSNa may be additionally performed before the application of a liquid polymer, thereby forming a protective layer.

Preparation Example 10: Manufacture of Super Water-Repellent Polymer Hierarchical Structure by Molding Super Water-Repellent Polymer Hierarchical Structure Having Concave Hemispherical Nano Structure A super water-repellent polymer hierarchical structure was manufactured according to one embodiment of the present invention.

FIG. 25 is a set of schematic cross-sectional views illustrating a method for manufacturing a super water-repellent polymer hierarchical structure according to Preparation Example 10 of the present invention.

Referring to FIG. 25(A), first, a super water-repellent polymer hierarchical structure including a ratchet structure and a concave hemispherical nano structure, which was manufactured in Preparation Example 7, was used as a second parent substrate 200A.

Referring to FIG. 25(B), subsequently, a liquid heterogeneous polymer material 30 was applied on the second parent substrate 200A.

More specifically, the second parent substrate 200A was liquefied at a high temperature (approximately 180° C.) using polydimethylsiloxane (PDMS) having a thermal resistance and polypropylene (PP) as a heterogeneous polymer material, and then applied on the second parent substrate 200A and cooled at room temperature to solidify for curing.

Referring to FIG. 25(C), the cured heterogeneous polymer 31 was separated from the second parent substrate 200A and washed.

Referring to FIG. 25(D), a different form of a super water-repellent polymer hierarchical structure 300 was manufactured using the above-described molding method. The super water-repellent polymer hierarchical structure 300 is a hierarchical structure having a ratchet structure 310 formed on the upper surface thereof and a convex hemispherical nano structure formed as a nano structure 320 on the ratchet structure 310. Also, both of the ratchet structure 310 and the nano structure 320 are composed of a polymer.

FIG. 26 is a set of photographs of the super water-repellent polymer hierarchical structure according to Preparation Example 10 of the present invention and an image illustrating the result of measuring a contact angle and a sliding angle.

FIG. 26(A) is a photograph of the super water-repellent polymer hierarchical structure according to Preparation Example 10, and FIG. 26(B) is an enlarged photograph of the super water-repellent polymer hierarchical structure surface of FIG. 26(A). Referring to FIGS. 26(A) and 26(B), it can be seen that a unidirectional super water-repellent polymer hierarchical structure may be formed using a hierarchical structure having a super water-repellent polymer hierarchical structure formed thereon and having both of a micro-scale ratchet structure and a nano-scale nano sphere-type structure. The upper surface of the manufactured super water-repellent polymer hierarchical structure is a structure having a ratchet structure, and a convex hemispherical nano structure corresponding to the concave hemispherical nano structure of the second parent substrate is formed on the surface of the ratchet structure.

FIG. 26(C) is an image illustrating the result of measuring a contact angle and a sliding angle of the super water-repellent polymer hierarchical structure Preparation Example 10. Referring to FIG. 26(C), it can be seen that the contact angle (θ) is 158 degrees, and the sliding angle is approximately less than 10 degrees.

FIG. 27 shows the result of measuring a contact angle after the super water-repellent polymer hierarchical structure according to Preparation Example 10 is repeatedly manufactured. Referring to FIG. 27, the super water-repellent polymer hierarchical structure was repeatedly manufactured seven times using the same second parent substrate and the contact angle of each structure was measured, and as a result, it can be seen that the contact angle is in the range of approximately 153 to 158 degrees. It can be seen that the structure of the second parent substrate is not damaged even after repeated molding, and the manufactured polymer hierarchical structures are able to maintain high super water-repellency.

According to the present invention, a super water-repellent polymer hierarchical structure which allows droplets to move in one direction without an externally-applied force while its surface is barely tilted because of the use of a ratchet structure and a super water-repellent nanowire structure may be provided.

In addition, a super water-repellent polymer hierarchical structure may be simply manufactured by only a method for utilizing a super water-repellent hierarchical structure and mechanically molding a polymer material on the super water-repellent polymer hierarchical structure.

In addition, the super water-repellent polymer hierarchical structure may be repeatedly manufactured as many as seven times using the molding method with respect to the parent substrate.

Since the manufactured super water-repellent polymer hierarchical structure has a sliding angle of almost less than 10 degrees, droplets roll down in one direction without an externally-applied force even when the surface of the polymer hierarchical structure is barely tilted, and thus can be applied in future water harvesting or various industries such as kitchen appliances and drains.

Hereinafter, a method for manufacturing a heat exchanger having super water-repellency according to one embodiment of the present invention will be described.

FIG. 28 is a flow chart illustrating a method for manufacturing a heat exchanger having super water-repellency according to one embodiment of the present invention.

Referring to FIG. 28, the method for manufacturing heat exchanger having super water-repellency according to one embodiment of the present invention includes preparing a pre-manufactured heat exchanger (S130), immersing the pre-manufactured heat exchanger in an alkaline solution (S230), forming a nano/micro structure on at least a heat transfer surface of the heat exchanger by immersing the pre-manufactured heat exchanger in an etching solution (S330), vacuum drying the formed nano/micro structure (S430), and applying oil on a surface of the vacuum-dried nano/micro structure (S530).

First, a pre-manufactured heat exchanger is prepared (S130). The present invention has an advantage of performing a process of realizing super water-repellency in a pre-manufactured heat exchanger by a method using an immersion method. Therefore, as super water-repellency is realized for each part of the heat exchanger, degradation in super water-repellency that can be generated during assembly may be prevented.

Such a heat exchanger may be, for example, a freezer, an air conditioner, or a heat pump. However, the heat exchanger includes, but is not limited to, all objects or apparatuses capable of enhancing the performance of the heat exchanger through dropwise condensation, the delay of frosting or easy removal of a steam condensate.

Subsequently, the pre-manufactured heat exchanger is immersed in an alkaline solution (S230). In this step (S230), when a heat transfer surface of the heat exchanger is composed of, for example, an aluminum alloy, a native oxide film on the surface of the aluminum alloy is removed.

Therefore, as such an alkaline solution, any material capable of removing a native oxide film from the heat transfer surface of the heat exchanger may be used. For example, the alkaline solution may be NaOH.

In addition, the immersing of the pre-manufactured heat exchanger in the alkaline solution (S230) may be performed at room temperature.

However, the immersing of the pre-manufactured heat exchanger in the alkaline solution (S230) can be omitted in some cases.

Subsequently, a nano/micro structure may be formed on at least the heat transfer surface of the heat exchanger by immersing the pre-manufactured heat exchanger in an etching solution (S330).

Here, to realize the super water-repellency on the heat transfer surface of the heat exchanger by vacuum drying, which will be described below, the surface of the heat exchanger is preferably etched until the roughness satisfies the conditions in which the arithmetic average of absolute values ($R_a$) is 4.76 µm or more, the root mean squared ($R_q$) is 5.81 µm or more, and the maximum height of the profile ($R_t$) is 35.06 µm or more.

If the roughness of the surface of the heat exchanger does not satisfy the above-mentioned conditions, an air layer capable of exhibiting super water-repellency between a droplet and the nano/micro structure on the surface may not be sufficiently formed, and therefore the super water-repellency may not be exhibited even by vacuum drying, which will be described below.

The etching solution may be suitably selected according to a material for the heat transfer surface. The etching solution may be an acid solution. For example, to etch an Al surface, as the etching solution, a dilute HCl solution may be used. As another example, to etch stainless steel (SUS304), as the etching solution, a mixed aqueous solution including iron (III) chloride ($FeCl_3$), HCl, phosphoric acid ($H_3PO_4$) and hydrogen peroxide ($H_2O_2$) may be used.

Accordingly, a nano/micro structure may be formed on the surface of a material for the heat exchanger such as an aluminum alloy or stainless steel by etching the material by immersing the pre-manufactured heat exchanger in the etching solution using the above-described immersion method. Thus, the present invention can be applied to a large-sized heat exchanger with a complicated shape, and does not need expensive equipment.

Subsequently, the nano/micro structure formed by the above-described etching process is vacuum-dried (S430). Hydrophilic ions such as $OH^-$, $Cl^-$ and the like may be removed from the nano/micro structure by the above-mentioned vacuum drying.

The vacuum drying of the nano/micro structure (S430) may be performed in a vacuum atmosphere of 0.1 to 1 Torr at 150 to 180° C. for 1 to 2 hours.

When the vacuum drying is performed under the above-described conditions, hydrophilic ions such as $OH^-$, $Cl^-$ and the like may be more effectively removed from the nano/micro structure.

Therefore, the super water-repellency may be realized on at least the heat transfer surface of the pre-manufactured heat exchanger using an immersion method and a vacuum drying method. That is, since the heat transfer surface of the heat exchanger may have a sliding angle of 10 degrees or less, droplets generated on the heat transfer surface may roll down to increase the efficiency of the heat exchanger.

On the other hand, after the vacuum drying of the formed nano/micro structure, the application of oil on a surface of the vacuum-dried nano/micro structure may be further included.

Such application of oil may be performed by, for example, spin coating.

Such additional application of oil may allow droplets generated on the heat transfer surface to roll down using the super water-repellency exhibited on the heat transfer surface of the heat exchanger, and may desorb and separate droplets or frost generated on the heat transfer surface that is reduced in adhesive strength according to the state of the droplets. As a result, the efficiency of the heat exchanger may be increased.

Here, the oil may be fluorinated oil.

Meanwhile, fluoro-based coating used for conventional water repellent coating uses a fluoro-based coating material such as heptadecafluoro-1,1,2,2-tetrahydrodecyltrichlorosilane or (tridecafluoro-1,1,2,2-tetrahydrooctyl)trichlorosilane, and water repellent coating is achieved by chemical bonding between the fluoro-based coating material and the surface. Therefore, the fluoro-based coating imparts water repellency to the heat transfer surface, but since durability is drastically decreased in a high temperature and humidity environment due to unstable chemical bonding, it is difficult to be applied to the heat exchanger. In addition, the fluoro-based coating material used in the water repellent coating does not reduce a frost adhesive strength.

On the other hand, the fluorinated oil used in the present invention may be applied on the heat transfer surface to penetrate between the nano/micro structures on the heat transfer surface, but there is no chemical bonding between the surface and the fluorinated oil. Accordingly, as the fluorinated oil is applied to the nano/micro structure on the heat transfer surface, a low sliding angle may be maintained, and a steam condensate rolls down before being frozen to eliminate the cause of frosting. In addition, due to the reduced frost adhesive strength, defrosting is easily performed, and thus the efficiency of the heat exchanger may be increased.

A heat exchanger having super water-repellency according to one embodiment of the present invention will be described.

The heat exchanger having super water-repellency according to one embodiment of the present invention may be manufactured using the pre-manufactured heat exchanger by the above-described process.

For example, the heat exchanger having super water-repellency according to one embodiment of the present invention includes a heat transfer surface and a nano/micro structure formed on a surface including at least the heat transfer surface, wherein the nano/micro structure is characterized by being coated with oil.

The surface roughness of the heat transfer surface may satisfy the conditions in which the arithmetic average of absolute values ($R_a$) is 4.76 µm or more, the root mean squared ($R_q$) is 5.81 µm or more, and the maximum height of the profile ($R_t$) is 35.06 µm or more.

In addition, hydrophilic ions such as $OH^-$, $Cl^-$ and the like may be removed from the nano/micro structure on the heat transfer surface by vacuum drying.

Therefore, the heat transfer surface on which the nano/micro structure is formed may have a sliding angle of 10 degrees or less.

The oil applied to the nano/micro structure may be fluorinated oil. In addition, the applied oil does not have a chemical bond with the nano/micro structure, and is characterized by being present in a liquid phase between such nano/micro structures.

Thus, as oil is applied to a surface of the nano/micro structure and penetrates between the nano/micro structures, the adhesive strength of droplets, for example, a frosting adhesive strength may be reduced.

Thus, when droplets are generated on the heat transfer surface of the heat exchanger due to the oil-coated nano/micro structure formed on the heat transfer surface of the heat exchanger, a sliding angle is 10 degrees or less, and therefore the droplets may roll down. In addition, since the adhesive strength to the droplets is decreased due to the application of oil, droplets or frost generated or frozen on the heat transfer surface may be detached and removed.

Preparation Example 11

Super water-repellency was realized for an aluminum alloy (Al alloy) specimen using an immersion method and a vacuum drying method according to the present invention.

First, the Al alloy specimen was prepared.

Subsequently, the aluminum alloy specimen was immersed in a 1M NaOH solution at room temperature for 30 minutes to 1 hour to remove a native oxide film on the aluminum alloy surface.

Subsequently, as an etching solution, a mixed solution of HCl (purity: 37%):$H_2O$=2:20 ml was prepared at room temperature. The aluminum alloy specimen was immersed in the etching solution, thereby forming a nano/micro structure on the aluminum alloy surface. Here, the immersion was performed for 0 (only NaOH), 5, 10, 15 or 20 minutes.

Subsequently, vacuum drying was performed in a vacuum atmosphere of 0.1 to 1 Torr at 150 to 180° C. for 1 to 2 hours.

FIG. 29 is a set of images showing measured contact angles and sliding angles of a specimen prepared according to Preparation Example 11.

Referring to FIG. 29, when the time for immersion in the etching solution was 0 (only NaOH), 5 or 10 minutes, the contact angle (CA) was approximately 75, 133 or 141 degrees, respectively, and the sliding angle (SA) was a pinned state. Such a pinned state indicates that droplets are fixed while the surface is tilted at 90 degrees.

In addition, when the time for immersion in the etching solution was 15 minutes or 20 minutes, the contact angle (CA) was approximately 155 degrees, and the sliding angle (SA) was approximately 5 degrees in all cases, which indicates that super water-repellency was realized.

Accordingly, it can be seen that the super water-repellency is exhibited by performing vacuum drying after the immersion is performed for a predetermined time or more.

FIGS. 30 to 33 are images showing the roughness of etched surfaces of the specimen prepared according to Preparation Example 11, and FIGS. 34 to 37 are images of the specimen prepared according to Preparation Example 11 and contact angles and sliding angles thereof.

FIGS. 30 and 34 show the results of etching performed for 5 minutes. Referring to FIG. 30, it can be seen that $R_a$ is 2.03 μm, $R_q$ is 2.52 μm, and $R_t$ is 22.11 μm. In addition, referring to FIG. 34, it can be seen that the contact angle (CA) is approximately 133 degrees, and the sliding angle (SA) is a pinned state.

FIGS. 31 and 35 show the results of etching performed for 10 minutes. Referring to FIG. 31, it can be seen that $R_a$ is 3.94 μm, $R_q$ is 4.95 μm, and $R_t$ is 37.19 μm. In addition, referring to FIG. 35, it can be seen that the contact angle (CA) is approximately 141 degrees, and the sliding angle (SA) is a pinned state.

FIGS. 32 and 36 show the results of etching performed for 15 minutes. Referring to FIG. 32, it can be seen that $R_a$ is 4.76 μm, $R_q$ is 5.81 μm, and $R_t$ is 35.06 μm. In addition, referring to FIG. 36, the contact angle (CA) is approximately 155 degrees and the sliding angle (SA) is approximately 5 degrees, which can indicate that super water-repellency is exhibited.

FIGS. 33 and 37 show the results of etching performed for 20 minutes. Referring to FIG. 33, it can be seen that $R_a$ is 4.78+1.06 μm, $R_q$ is 5.86 μm, and $R_t$ is 39.14 μm. In addition, referring to FIG. 37, the contact angle (CA) is approximately 155 degrees and the sliding angle (SA) is approximately 5 degrees, which can indicate that super water-repellency is exhibited.

Preparation Example 12

Super water-repellency was realized for an Al alloy specimen using an immersion method and a vacuum drying method according to the present invention.

First, the Al alloy specimen was prepared.

Subsequently, the aluminum alloy specimen was immersed in a 1M NaOH solution at room temperature for 30 minutes to 1 hour to remove a native oxide film on the Al alloy surface.

Subsequently, a mixed solution of HCl (purity: 37%): $H_2O$=1:20 ml was prepared as an etching solution at room temperature. The Al alloy specimen was immersed in the etching solution to form a nano/micro structure on the Al alloy surface. Here, the immersion was performed for 0 (only NaOH), 1, 1.5, 2, 2.5, 3 or 3.5 hours.

Subsequently, vacuum drying was performed in a vacuum atmosphere of 0.1 to 1 Torr at 150 to 180° C. for 1 to 2 hours.

FIG. 38 is a set of images showing measured contact angles and sliding angles of a specimen prepared according to Preparation Example 12.

Referring to FIG. 38, when the time for immersion in the etching solution was 0 (only NaOH), 1, 1.5, 2 or 2.5 hours, the contact angle (CA) was approximately 75, 138, 148, 148 or 150 degrees, respectively, and the sliding angle (SA) was pinned, pinned, approximately 25, 25 or 25 degrees, respectively.

In addition, when the time for immersion in the etching solution was 3 or 3.5 hours, the contact angle (CA) was approximately 153 or 152 degrees, respectively, and the sliding angle (SA) was approximately 9 degrees in all cases, which indicates that super water-repellency was realized.

Thus, it can be seen that the super water-repellency is realized by performing vacuum drying after etching for a predetermined time or more.

Preparation Example 13

Super water-repellency was realized for an Al alloy specimen using an immersion method and a vacuum drying method according to the present invention.

First, the Al alloy specimen was prepared.

Subsequently, the Al alloy specimen was immersed in a 1M NaOH solution at room temperature for 30 minutes to 1 hour to remove a native oxide film from the Al alloy surface.

Subsequently, a mixed solution of HCl (purity: 37%): $H_2O$=10:20 ml was prepared at room temperature as an etching solution. The Al alloy specimen was immersed in the etching solution to form a nano/micro structure on the Al alloy surface. Here, the immersion was performed for 0 (only NaOH), 1, 2, 3, 4, 5 or 6 minutes.

Subsequently, vacuum drying was performed in a vacuum atmosphere of 0.1 to 1 Torr at 150 to 180° C. for 1 to 2 hours.

FIG. 39 is a set of images showing measured contact angles and sliding angles of a specimen prepared according to Preparation Example 13.

Referring to FIG. 39, when the time for immersion in the etching solution was 0 (only NaOH), 1, 2 or 3 minutes, the contact angle (CA) was approximately 75, 116, 132 or 150 degrees, respectively, and the sliding angle (SA) was pinned, pinned, pinned or approximately 25 degrees, respectively.

In addition, when the time for immersion in the etching solution was 4, 5 or 6 minutes, the contact angle (CA) was approximately 156, 154 or 156 degrees, respectively, and the sliding angle (SA) was approximately 5 degrees in all cases, indicating that super water-repellency was realized.

Thus, it can be seen that the super water-repellency is realized by performing vacuum drying after etching for a predetermined time or more.

Preparation Example 14

An Al alloy specimen having super water-repellency and a decreased adhesive strength was manufactured by an immersion method, a vacuum drying method and the application of oil according to the present invention.

First, the Al alloy specimen was prepared.

Subsequently, the Al alloy specimen was immersed in a 1M NaOH solution at room temperature for 30 minutes to 1 hour to remove a native oxide film from the Al alloy surface.

Subsequently, a mixed solution of HCl (purity: 37%): $H_2O$=10:20 ml was prepared at room temperature as an etching solution. The Al alloy specimen was immersed in the etching solution to form a nano/micro structure on the Al alloy surface. Here, the immersion was performed for 5 minutes.

Subsequently, vacuum drying was performed in a vacuum atmosphere of 0.1 to 1 Torr at 150 to 180° C. for 1 to 2 hours.

Subsequently, fluorinated oil was applied on the surface of the Al alloy specimen by spin coating (spinning speed: 1000 rpm) at room temperature.

FIG. 40 is an image showing a measured contact angle and sliding angle of a specimen of Preparation Example 14 before the application of oil.

Referring to FIG. 40, the contact angle (CA) was approximately 154 degrees, and the sliding angle (SA) was approximately 5 degrees, indicating that super water-repellency was realized.

FIG. 41 is an image showing a measured contact angle and sliding angle of the specimen of Preparation Example 14 after the application of oil.

Referring to FIG. 41, the contact angle (CA) is approximately 116 degrees, and the sliding angle (SA) is approximately 9 degrees. Accordingly, it can be seen that the sliding angle is maintained at 10 degrees or less after the application of oil. Thus, it can be seen that, when the oil is applied, droplets can easily roll down, and attached frost can also be easily detached.

Comparative Example 3

A bare Al alloy specimen was prepared.

Fluorinated oil was applied on the surface of the bare Al alloy specimen by a spin coating method (spinning speed: 1000 rpm).

FIG. 42 is an image showing a measured contact angle and sliding angle of a specimen of Comparative Example 3 before the application of oil.

Referring to FIG. 42, the contact angle (CA) is approximately 75 degrees, and the sliding angle (SA) is a pinned state, which can indicate that super water-repellency is not realized.

FIG. 43 is an image showing a measured contact angle and sliding angle of a specimen of Comparative Example 3 after the application of oil.

Referring to FIG. 43, the contact angle (CA) is approximately 103 degrees, and the sliding angle (SA) is a pinned state, which can indicate that super water-repellency is not realized.

Thus, it can be seen that the super water-repellency cannot be realized simply by the application of oil.

According to the present invention, super water-repellency may be realized in the pre-manufactured heat exchanger using an immersion method. That is, the pre-manufactured heat exchanger may be immersed in a solution to etch a heat transfer surface of the heat exchanger in the solution, thereby forming a nano/micro structure on the heat transfer surface, followed by vacuum drying or the additional application of oil on the surface of the nano/micro structure, and thus a heat exchanger having super water-repellency can be realized.

As advantages obtained thereby, first, in all regions into which a solution is able to penetrate, water repellency or super water-repellency can be uniformly realized, and the pre-manufactured heat exchanger is immersed in a solution, thereby easily manufacturing a water repellent or super water-repellent heat exchanger. Therefore, there is no problem of damage to a nano/micro structure or water repellent coating, which can be generated in assembly of individual parts.

Second, since super water-repellency can be uniformly realized in all regions into which a solution is able to penetrate, a heat exchanger having super water-repellency can be easily manufactured by immersing the pre-manufactured heat exchanger in a solution, and a method described above, since it is a solution-based method, can be applied to a large-sized heat exchanger with a complicated shape.

Third, since the pre-manufactured heat exchanger is directly used in manufacture of a heat exchanger having super water-repellency, a process is simple, low cost and less time consuming, and therefore the present invention can be easily applied in the future heat exchanger industry.

Fourth, as the heat exchanger having super water-repellency is manufactured, heat transfer resistance is minimized due to dropwise condensation and a phenomenon in which droplets easily roll down, heat transfer performance and the efficiency of the heat exchanger can be easily enhanced, and the efficiency of the heat exchanger can be maximized by minimizing heat transfer resistance, pressure loss, the number of defrosting cycles, and easy removal of frost during a defrosting process as frosting is delayed.

In addition, as an adhesive strength to droplets or frost is reduced by the application of oil on the nano/micro structure, the efficiency of the heat exchanger can be further enhanced due to the above-described effects.

The embodiments disclosed in the specification and drawings are only illustrated to help in understanding the present invention, and are not intended to limit the scope of the present invention. It will be apparent to those of ordinary skill in the art that other modifications based on the technical idea of the present invention are possible to be realized, in addition to the embodiments disclosed herein.

EXPLANATION OF REFERENCE NUMERALS

20: Liquid polymer 21: Cured polymer
22: Polymer structure 30: Liquid heterogeneous polymer
31: Cured heterogeneous polymer 100: Parent substrate
110: Ratchet structure 120: Super water-repellent nano structure
130: Protective layer 200: Polymer hierarchical structure
200A: Second parent substrate 210: Ratchet structure
220: Nano structure 230: Protective layer
300: Polymer hierarchical structure 310: Ratchet structure
320: Nano structure

The invention claimed is:

1. A method for manufacturing a super water-repellent polymer hierarchical structure, comprising:
    forming a parent substrate having ratchet structure formed on an upper surface thereof and a super water-repellent nano structure formed on the ratchet structure;
    forming a protective layer for preventing the detachment of the super water-repellent nano structure on the super water-repellent nano structure;
    applying a liquid polymer on the parent substrate;
    curing the applied liquid polymer; and
    separating the cured polymer from the parent substrate and washing the separated polymer, wherein the polymer separated from the parent substrate has a sliding angle of less than 10 degrees, and wherein the protective layer includes a metallic material or a polymer material.

2. The method of claim 1, wherein the parent substrate is a metal substrate, a ceramic substrate or a polymer substrate.

3. The method of claim 1, wherein the forming of a parent substrate includes:

forming a ratchet structure on the upper surface of a substrate; and forming a super water-repellent nano structure on the ratchet structure.

4. The method of claim 1, wherein the ratchet structure is characterized by the conditions in which an absolute value of $W_2-W_1$ is 50 degrees or more, and a height of a constituent triangle of a ratchet structure is 100 to 400 μm, where the $W_1$ is one of the two lower angles of the constituent triangle of the ratchet structure, and the $W_2$ is the other of the two lower angles of the constituent triangle of the ratchet structure.

5. The method of claim 1, wherein the super water-repellent nano structure is a nanowire structure, a nano sphere structure or a nano hole structure.

6. The method of claim 1, wherein the forming of a super water-repellent nano structure on the ratchet structure is performed with a hydrothermal synthesis method, a chemical solution etching method or a nano structure application method.

7. The method of claim 1, wherein the protective layer has a thickness of 20 to 300 nm.

8. The method of claim 1, wherein the metallic material of the protective layer includes aluminum (Al), gold (Au) or platinum (Pt).

9. The method of claim 1, wherein the polymer material of the protective layer is polydimethylsiloxane (PDMS), polymethylmethacrylate (PMMA), polyethylene (PE), polyvinylidene fluoride (PVDF), or polyethersulfone (PES).

10. The method of claim 1, wherein the liquid polymer is polydimethylsiloxane (PDMS), polymethylmethacrylate (PMMA), polypropylene (PP), polyurethane (PU), polyethylene (PE), polyvinylidene fluoride (PVDF), polytetrafluorethylene (PTFE) or polyethersulfone (PES).

11. A method for manufacturing a super water-repellent polymer hierarchical structure, comprising:

forming a first parent substrate having a ratchet structure formed on an upper surface thereof and a super water-repellent nano structure formed on the ratchet structure;

forming a protective layer for preventing the detachment of the super water-repellent nano structure on the super water-repellent nano structure;

applying a liquid polymer on the first parent substrate;

curing the applied liquid polymer;

forming a second parent substrate by separating the cured polymer from the first parent substrate and washing the separated polymer;

applying a liquid heterogeneous polymer on the second parent substrate;

curing the applied liquid heterogeneous polymer; and separating the cured heterogeneous polymer from the second parent substrate and washing the separated polymer, wherein the separated heterogeneous polymer has a sliding angle of less than 10 degrees and wherein the protective layer includes a metallic material or a polymer material.

12. The method of claim 11, wherein the ratchet structure is characterized by an absolute value of $W_2-W_1$ is 50 degrees or more, and a height of a constituent triangle of a ratchet structure is 100 to 400 μm, where the $W_1$ is one of the two lower angles of the constituent triangle of the ratchet structure, and the $W_2$ is the other of the two lower angles of the constituent triangle of the ratchet structure.

13. The method of claim 11, wherein the protective layer has a thickness of 20 to 300 nm.

14. The method of claim 11, wherein the metallic material of the protective layer is aluminum (Al), gold (Au) or platinum (Pt).

15. The method of claim 11, wherein the polymer material of the protective layer is polydimethylsiloxane (PDMS), polymethylmethacrylate (PMMA), polyethylene (PE), polyvinylidene fluoride (PVDF) or polyethersulfone (PES).

* * * * *